(12) United States Patent
Mabuchi

(10) Patent No.: US 8,343,861 B2
(45) Date of Patent: Jan. 1, 2013

(54) ION IMPLANTATION METHOD, METHOD OF PRODUCING SOLID-STATE IMAGING DEVICE, SOLID-STATE IMAGING DEVICE, AND ELECTRONIC APPARATUS

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 417 days.

(21) Appl. No.: 12/557,195

(22) Filed: Sep. 10, 2009

(65) Prior Publication Data

US 2010/0065938 A1 Mar. 18, 2010

(30) Foreign Application Priority Data

Sep. 18, 2008 (JP) .................................. 2008-239903

(51) Int. Cl.
*H01L 21/425* (2006.01)
(52) U.S. Cl. ................. 438/527; 438/942; 257/E21.334
(58) Field of Classification Search .................. 438/531, 438/527, 517, 942, 945, 946
See application file for complete search history.

(56) References Cited

U.S. PATENT DOCUMENTS

2007/0054202 A1* 3/2007 Moriya et al. ................... 430/5
2007/0063234 A1* 3/2007 Itonaga ........................ 257/291

FOREIGN PATENT DOCUMENTS

| JP | 10-116975 | 5/1998 |
| JP | 2004-039832 | 2/2004 |
| JP | 2006-093319 | 4/2006 |
| JP | 2006-216577 | 8/2006 |

* cited by examiner

*Primary Examiner* — Alexander Ghyka
*Assistant Examiner* — Reema Patel
(74) *Attorney, Agent, or Firm* — SNR Denton US LLP

(57) ABSTRACT

An ion implantation method includes performing ion implantation a plurality of times using a plurality of ion implantation masks each including main mask portions, bridge portions connecting between the main mask portions, and openings corresponding to parts of annular regions where ions are to be implanted, whereby a plurality of annular ion-implanted regions are formed by combining the plurality of ion implantation masks.

21 Claims, 21 Drawing Sheets

ION IMPLANTATION METHOD, METHOD OF PRODUCING SOLID-STATE IMAGING DEVICE, SOLID-STATE IMAGING DEVICE, AND ELECTRONIC APPARATUS

BACKGROUND OF THE INVENTION

1. Field of the Invention

The present invention relates to an ion implantation method applied in producing a solid-state imaging device, a semiconductor device, or the like, a method of producing a solid-state imaging device using the ion implantation method, a solid-state imaging device, and an electronic apparatus such as a camera.

2. Description of the Related Art

Solid-state imaging devices are broadly divided into amplification-type solid-state imaging device represented by a complementary metal oxide semiconductor (CMOS) image sensor and a charge transfer-type solid-state imaging device represented by a charge coupled device (CCD) image sensor. These solid-state imaging devices are widely used in a digital still camera, a digital video camera, and the like. Recently, as a solid-state imaging device installed in a mobile device such as a camera cell phone or a personal digital assistant (PDA), a CMOS image sensor is often used from the standpoint of a low power supply voltage, electric power consumption etc.

A CMOS solid-state imaging device includes a pixel portion (imaging area) where a large number of pixels each including a photodiode functioning as a photoelectric conversion portion and a plurality of pixel transistors are arranged in a two-dimensional matrix shape, and a peripheral circuit portion. Examples of the structure of the pixel transistors constituting a pixel include a four-transistor structure having a transfer transistor, a reset transistor, an amplifying transistor, and a selection transistor, and a three-transistor structure in which the selection transistor in the four-transistor structure is omitted. Each of the pixels is driven by a pixel-driving wiring extending in the horizontal direction. A signal of the pixel is an analog signal and is output to a vertical signal line extending in the vertical direction.

The peripheral circuit portion includes a control circuit, a vertical drive circuit, column signal-processing circuits, a horizontal drive circuit, an output circuit etc. The control circuit receives an input clock and data that directs an operational mode etc. and outputs data of internal information etc. of the solid-state imaging device. In addition, the control circuit supplies the vertical drive circuit, the column signal-processing circuits, and the horizontal drive circuit with necessary clocks and pulses.

The vertical drive circuit selects a pixel-driving wiring and supplies the selected pixel-driving wiring with a pulse for driving a pixel. When a certain pixel-driving wiring is driven, a row of pixels corresponding to the pixel-driving wiring is driven at the same time.

The column signal-processing circuit is provided for every pixel column. On receiving signals of pixels of each column, the corresponding column signal-processing circuit performs processes such as a correlated double sampling (CDS, a process of removing fixed pattern noise), a signal amplification, and an A-D conversion to the signals.

The horizontal drive circuit sequentially selects the column signal-processing circuits and leads signals of the column signal-processing circuits to a horizontal signal line. The output circuit processes signals of the horizontal signal line and outputs the processed signals. For example, the output circuit may perform only buffering or may perform a black-level adjustment, a correction of variations between columns, various types of digital signal processing, and the like before the buffering.

FIG. 24 shows a schematic cross-sectional structure of a pixel portion. In FIG. 24, only a portion of a semiconductor region is shown, and other components such as a multilayer wiring layer, an on-chip color filter, and an on-chip microlens are omitted. In a pixel portion 101, one pixel 104 is isolated by a p-type semiconductor well region 102 where pixel transistors are formed, and a p-type semiconductor well region (i.e., plug semiconductor well region) 103 disposed under the p-type semiconductor well region 102. The p-type semiconductor well region 103 corresponds to a pixel isolation region. Although not shown in the figure, the pixel transistors are formed in the p-type semiconductor well region 102. A photodiode PD functioning as a photoelectric conversion portion constituting the pixel 104 includes a p-type semiconductor region 105 disposed on the surface and an n-type semiconductor region 106 which is disposed under the p-type semiconductor region 105 and which accumulates signal charges (electrons). An n-type semiconductor region 107 which has a low impurity concentration is formed under the n-type semiconductor region 106 functioning as a charge accumulation region in order to widely collect the signal charges (electrons) generated by photoelectric conversion in a deep portion.

The p-type semiconductor well region 103, which is the pixel isolation region, functions as a barrier so that the signal charges (electrons) are not moved to the adjacent photodiode PD. Furthermore, a p-type semiconductor region 108 for preventing an interface at the reverse surface side from depleting is provided under the p-type semiconductor well region 103 and the n-type semiconductor region 107 having a low impurity concentration.

As shown in FIG. 25 (which is a cross-sectional view taken along line XXV-XXV in FIG. 24), the p-type semiconductor well region 103 is formed in a grid shape to isolate the pixels 104.

Japanese Unexamined Patent Application Publication No. 2006-93319 discloses a solid-state imaging device in which a p-type semiconductor region is used as an element isolation region of the device. Japanese Unexamined Patent Application Publication No. 10-116975 discloses a solid-state imaging device in which a p-type channel region formed by ion implantation is used as a channel stop region. Japanese Unexamined Patent Application Publication No. 2004-39832 discloses a solid-state imaging device in which an STI structure is used as element isolation. Japanese Unexamined Patent Application Publication No. 2006-216577 discloses a solid-state imaging device in which a deep p-type semiconductor region is used as an element isolation region.

SUMMARY OF THE INVENTION

The above-described p-type semiconductor well region 103 functioning as a pixel isolation region is formed by ion-implanting boron, which is a p-type impurity, and the depth thereof reaches about 2 to 3 μm. Accordingly, an ion implantation apparatus whose implantation energy is on the order of mega electron volts (MeV) is used to form the p-type semiconductor well region 103.

In order to form the p-type semiconductor well region 103, as shown in FIG. 26 (plan view) and FIG. 27 (cross-sectional view), a resist mask 111, which is used as a mask for ion implantation, is formed on a surface of a semiconductor substrate 110, and boron is ion-implanted through the resist mask 111. In this case, the resist mask 111 is formed so as to have a columnar structure including columnar portions being arranged so as to be independent in each of pixels, i.e., in each of portions corresponding to the photodiodes PD in the figure. The boron ions are implanted in a region other than the resist mask 111, that is, in a grid-shaped region surrounding the resist mask 111. The p-type semiconductor well region 103 is formed at a deep position within the semiconductor substrate 110 by ion implantation with high implantation energy. Therefore, it is necessary that the resist mask 111 have a film thickness h1 in the range of about 3 to 5 μm.

Recently, a pixel pitch has been decreased to 1.75 μm or less, and thus the resist mask 111 has a structure in which a large number of narrow and long columnar portions stand upright at small intervals. In such a case, as shown in FIG. 28, some of columnar portions 111a of the resist mask 111 fall over in a step of development, ion implantation, and the like. As a result, a problem of a deformation of a pattern of the resist mask 111 may occur.

To counter this problem, as an ion implantation method for forming the p-type semiconductor well region 103, a method in which ion implantation is separately performed in two steps is known. This example is shown in FIGS. 29 to 33. Two resist masks, namely, a first resist mask 121 and a second resist mask 122, are used as resist masks. As shown in FIG. 29, the first resist mask 121 includes a plurality of linear portions 113 extending in the horizontal direction and arranged in parallel in the vertical direction and first openings 114 extending in the horizontal direction and arranged between the linear portions 113. As shown in FIG. 30, the second resist mask 122 includes a plurality of linear portions 115 extending in the vertical direction and arranged in parallel in the horizontal direction and second openings 116 extending in the vertical direction and arranged between the linear portions 115.

First, the first resist mask 121 is formed on a semiconductor substrate 110, and boron is then ion-implanted through the first resist mask 121 to form a plurality of horizontal ion-implanted regions 131 arranged in parallel and extending in the horizontal direction, as shown in FIG. 31 (plan view). Next, the second resist mask 122 is formed on the semiconductor substrate 110, and boron is then ion-implanted through the second resist mask 122 to form a plurality of vertical ion-implanted regions 132 arranged in parallel and extending in the vertical direction, as shown in FIG. 32 (plan view). As shown in FIG. 33, a grid-shaped p-type semiconductor well region 133, which is to be formed into a pixel isolation region, is formed by the horizontal ion-implanted regions 131 and the vertical ion-implanted regions 132.

In this ion implantation method, the resist masks 121 and 122 are formed in a linear shape, and thus resistance to falling over is improved as compared with the resist mask 111 shown in FIG. 27. However, when viewed from a cross section perpendicular to the lines, the resist mask formed by this method has the same shape as that shown in FIG. 28. Accordingly, the problem of falling over may occur. It is difficult to form the first resist mask 121 and the second resist mask 122 in which several thousands of the linear portions 113 and 115, respectively, each having a height of 5 μm and a length of several millimeters are arranged in parallel at a pitch on the order of 1 μm so that the linear portions 113 and 115 are stably arranged without falling over. As the pixel size further decreases, falling over of the linear portions 113 and 115 may occur more significantly. Furthermore, in this ion implantation method, as shown in FIG. 33, ion implantation is performed twice at intersecting portions 134. As a result, problems such as an uneven concentration of the p-type semiconductor well region 133 and an increase in defects due to ion implantation may occur.

Such problems described above may occur not only in producing a solid-state imaging device but also in producing a semiconductor device when a grid-shaped or another annular-shaped ion-implanted region is formed.

In view of the above-described points, it is desirable to provide an ion implantation method with which a suitable ion-implanted region including annular regions can be formed using masks for ion implantation (hereinafter referred to as "ion implantation masks") in which a problem of falling over does not occur even for a fine pattern. It is also desirable to provide a method of producing a solid-state imaging device with which a suitable pixel isolation region can be formed using the ion implantation method, the solid-state imaging device, and an electronic apparatus including the solid-state imaging device.

An ion implantation method according to an embodiment of the present invention includes performing ion implantation a plurality of times using a plurality of ion implantation masks each including main mask portions, bridge portions connecting between the main mask portions, and openings corresponding to parts of annular regions where ions are to be implanted, whereby a plurality of annular ion-implanted regions are formed by combining the plurality of ion implantation masks.

In the ion implantation method according to an embodiment of the present invention, masks each including main mask portions and bridge portions connecting between the main mask portions are used, and thus the main mask portions do not fall over and the masks can function as stable ion implantation masks even having a fine pattern. Annular ion-implanted regions are formed by performing ion implantation a plurality of times using a plurality of ion implantation masks each including openings corresponding to parts of annular regions where ions are to be implanted. Accordingly, in the annular ion-implanted regions, ion implantation is performed substantially once over the entire area. Consequently, the impurity concentration is substantially uniform, and the generation of defects due to ion implantation can be suppressed.

A method of producing a solid-state imaging device according to an embodiment of the present invention includes performing ion implantation a plurality of times using a plurality of ion implantation masks each including main mask portions, bridge portions connecting between the main mask portions, and openings corresponding to parts of annular regions where ions are to be implanted, whereby an annular isolation region of semiconductor, the isolation region isolating pixels each including a photoelectric conversion portion, is formed by combining the plurality of ion implantation masks.

In the method of producing a solid-state imaging device according to an embodiment of the present invention, masks each including main mask portions and bridge portions connecting between the main mask portions are used, and thus the main mask portions do not fall over and the masks can function as stable ion implantation masks even having a fine pattern. An annular isolation region of semiconductor, the isolation region isolating pixels, is formed by performing ion implantation a plurality of times using a plurality of ion implantation masks each having openings corresponding to parts of annular regions where ions are to be implanted. Accordingly, in the annular isolation region of semiconductor, ion implantation is performed substantially once over the entire area. Consequently, the impurity concentration is substantially uniform, and the generation of defects due to ion implantation can be suppressed.

A solid-state imaging device according to an embodiment of the present invention includes a plurality of pixels each including a photoelectric conversion portion; and a grid-shaped isolation region of semiconductor, the isolation region isolating the pixels and being formed by performing ion implantation using first and second ion implantation masks each including main mask portions, bridge portions connecting between the main mask portions, and openings corresponding to part of a grid-shaped region where ions are to be implanted.

The solid-state imaging device according to an embodiment of the present invention is produced by the above method. Accordingly, even when the pixel size is reduced, the solid-state imaging device can include a pixel isolation region and pixels having high accuracy. Thus, a reduction in size and an improvement of the image quality can be achieved.

An electronic apparatus according to an embodiment of the present invention includes a solid-state imaging device, an optical system configured to guide incident light to the solid-state imaging device, and a signal-processing circuit configured to process a signal output from the solid-state imaging device. The solid-state imaging device includes a plurality of pixels each including a photoelectric conversion portion, and a grid-shaped isolation region of semiconductor, the isolation region isolating the pixels and being formed by performing ion implantation using first and second ion implantation masks each including main mask portions, bridge portions connecting between the main mask portions, and openings corresponding to part of a grid-shaped region where ions are to be implanted.

The electronic apparatus according to an embodiment of the present invention includes the solid-state imaging device produced by the above method, and thus the pixel size can be reduced and a reduction in the size of the electronic apparatus can be realized.

According to the ion implantation method according to an embodiment of the present invention, suitable annular ion-implanted regions can be formed. According to the method of producing a solid-state imaging device according to an embodiment of the present invention, a suitable pixel isolation region can be formed by employing the ion implantation method, and a high-quality solid-state imaging device including fine pixels can be produced. According to the solid-state imaging device according to an embodiment of the present invention, a high-quality solid-state imaging device including fine pixels can be provided. According to the electronic apparatus according to an embodiment of the present invention, the pixel size in a solid-state imaging device can be reduced, and a compact, high-quality electronic apparatus can be provided.

DESCRIPTION OF THE PREFERRED EMBODIMENTS

Embodiments of the present invention will now be described with reference to the drawings.

First, a description will be made of an ion implantation method and a method of producing a solid-state imaging device, more specifically, a CMOS solid-state imaging device according to an embodiment of the present invention.

Figure 1:
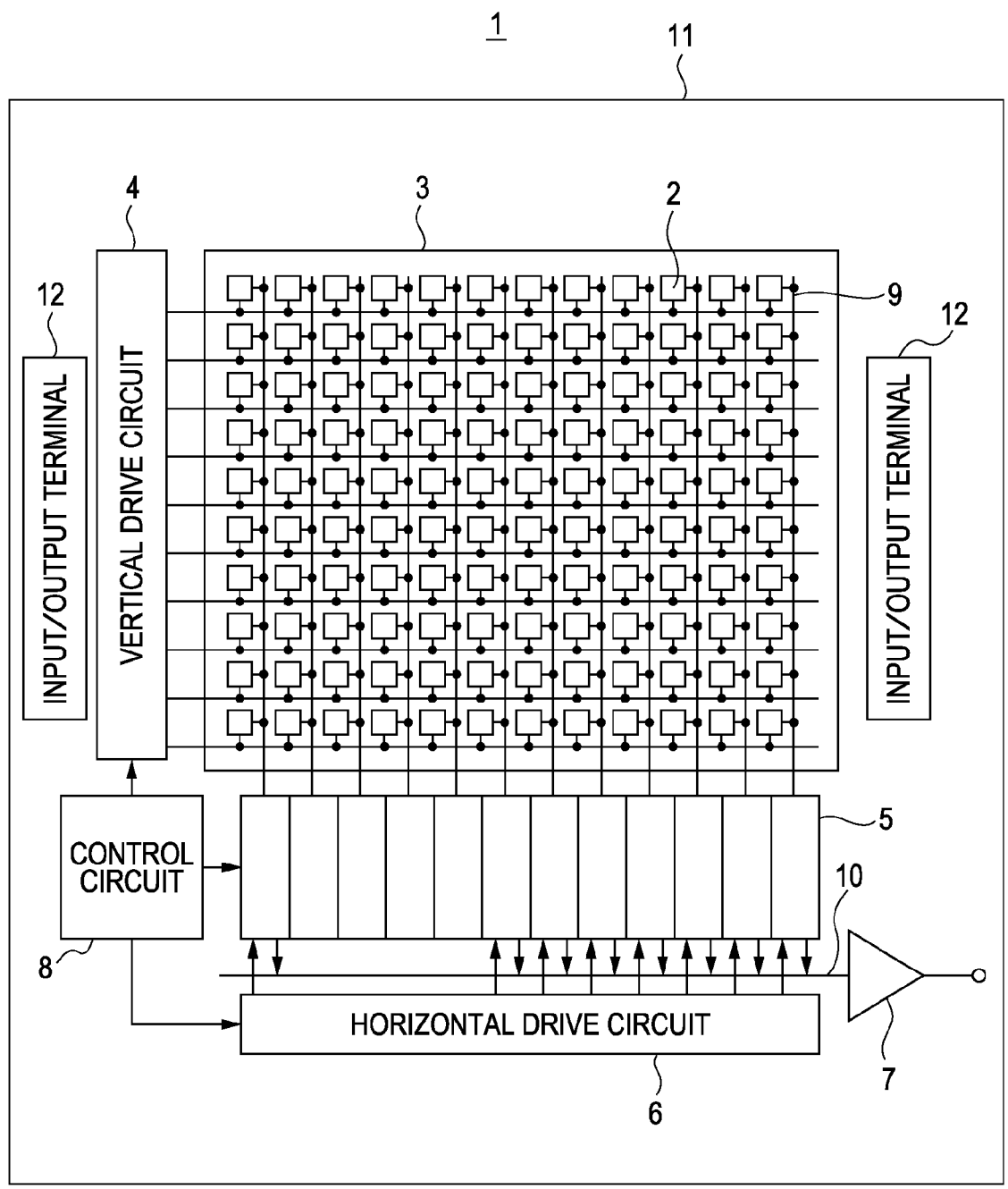
FIG. 1 is a schematic structural diagram showing an example of a solid-state imaging device that is applied to an embodiment of the present invention.
Figure 2:
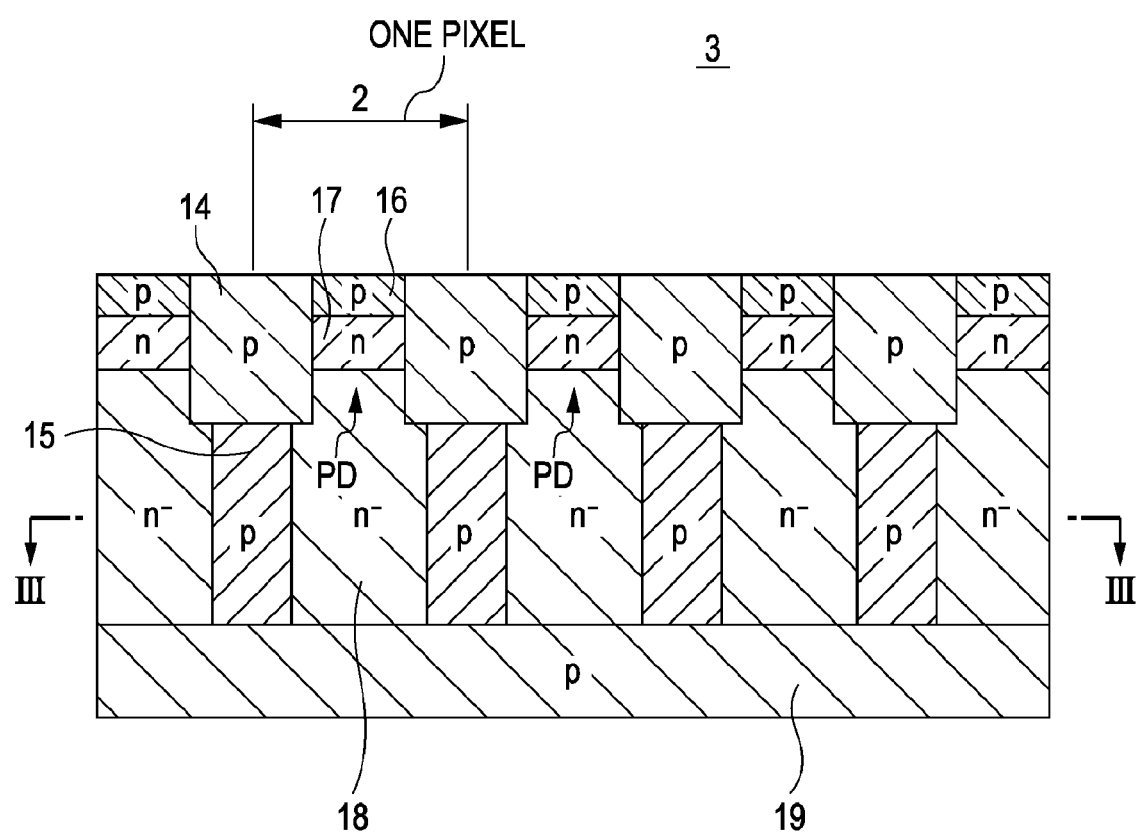
FIG. 2 is a schematic cross-sectional view showing a relevant part of a pixel portion of FIG. 1.
Figure 3:
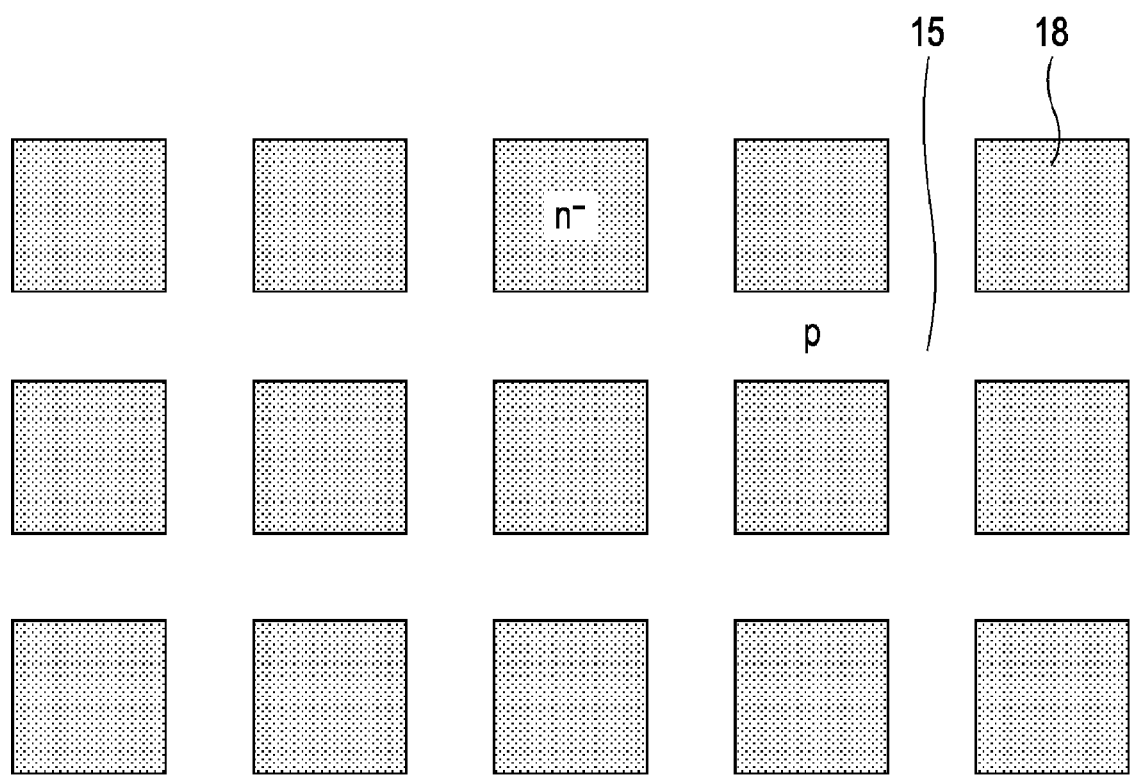
FIG. 3 is a cross-sectional view taken along line III-III of FIG. 2.

FIGS. 1 to 3 show a schematic structure of an example of a CMOS solid-state imaging device that is applied to an embodiment of the present invention. As shown in FIG. 1, a solid-state imaging device 1 of this embodiment includes a pixel portion (imaging area) 3 and a peripheral circuit portion. In the pixel portion 3, a plurality of pixels 2 each including a photoelectric conversion element are regularly and two-dimensionally arranged on a semiconductor substrate 1 such as a silicon substrate. Each of the pixels 2 includes a photoelectric conversion element, e.g., a photodiode, and a plurality of pixel transistors (MOS transistors). The plurality of pixel transistors may be constituted by, for example, three transistors, namely, a transfer transistor, a reset transistor, and an amplifying transistor. Alternatively, the plurality of pixel transistors may be constituted by, for example, four transistors, namely, a selection transistor and the above three transistors. An equivalent circuit of a unit pixel is the same as the typical one.

The peripheral circuit portion includes a vertical drive circuit 4, column signal-processing circuits 5, a horizontal drive circuit 6, an output circuit 7, a control circuit 8 etc.

The control circuit 8 receives an input clock and data that directs an operational mode etc. and outputs data of internal information etc. of the solid-state imaging device. Specifically, in the control circuit 8, clock signals and control signals used as a standard of the operation of the vertical drive circuit 4, the column signal-processing circuits 5, the horizontal drive circuit 6 etc. are generated on the basis of a vertical synchronizing signal, a horizontal synchronizing signal, and a master clock. The control circuit 8 inputs these signals to the vertical drive circuit 4, the column signal-processing circuits 5, the horizontal drive circuit 6 etc.

The vertical drive circuit 4 is constituted by, for example, a shift register. The vertical drive circuit 4 selects a pixel-driving wiring, supplies the selected pixel-driving wiring with a pulse for driving a pixel, and drives pixels in units of rows. More specifically, the vertical drive circuit 4 sequentially selects and scans the pixels 2 of the pixel portion 3 in units of rows in the vertical direction. The vertical drive circuit 4 supplies each of the column signal-processing circuits 5, through a corresponding vertical signal line 9, with a pixel signal which is based on a signal charge generated in a photoelectric conversion element, e.g., photodiode, of each pixel 2 in accordance with the amount of light received.

The column signal-processing circuit 5 is provided for, for example, every column of the pixels 2. The column signal-processing circuit 5 performs signal processing, such as noise reduction, for signals output from one row of pixels 2 in units of pixel columns. More specifically, each of the column signal-processing circuits 5 performs signal-processing such as CDS for removing fixed pattern noise specific to the pixels 2, a signal amplification, an A-D conversion etc. At the output stage of each of the column signal-processing circuits 5, a horizontal selecting switch (not shown) is provided by being connected between the column signal-processing circuit 5 and a horizontal signal line 10.

The horizontal drive circuit 6 is constituted by, for example, a shift register. The horizontal drive circuit 6 selects the column signal-processing circuits 5 in order by sequentially outputting a horizontal scanning pulse, and allows each of the column signal-processing circuits 5 to output a pixel signal to the horizontal signal line 10.

The output circuit 7 performs signal processing for signals sequentially supplied from each of the column signal-processing circuits 5 through the horizontal signal line 10 and outputs the processed signals. For example, the output circuit 7 may perform only buffering or may perform a black-level adjustment, a correction of variations between columns, various types of digital signal processing, and the like. Input/output terminals 12 exchange signals to the outside.

FIG. 2 shows a schematic cross-sectional structure of a relevant part of the pixel portion 3. In FIG. 2, only a portion of a semiconductor region is shown, and other components such as a multilayer wiring layer, an on-chip color filter, and an on-chip microlens are omitted. The pixel portion 3 includes a plurality of pixels 2 each composed of a photodiode PD and pixel transistors (not shown) and a pixel isolation region 15 that isolates the pixels 2 to each other. One pixel 2 is isolated by a semiconductor well region 14 of a first conductivity type, for example, p-type, where the pixel transistors are formed, and the pixel isolation region (isolation region of semiconductor) 15 composed of a p-type semiconductor well region (i.e., plug semiconductor well region) disposed under the semiconductor well region 14. Although not shown in the figure, the pixel transistors are formed in the p-type semiconductor well region 14. The photodiode PD functioning as a photoelectric conversion portion constituting the pixel 2 includes a p-type semiconductor region 16 disposed on the surface and an n-type semiconductor region 17 which is disposed under the p-type semiconductor region 16 and which accumulates signal charges (electrons). An n-type semiconductor region 18 functioning as a photoelectric conversion portion of the photodiode PD and having a low impurity concentration is formed under the n-type semiconductor region 17 functioning as a charge accumulation region. That is, the n-type semiconductor region 18 which has a low impurity concentration is formed in order to widely collect the signal charges (electrons) generated by photoelectric conversion in a deep portion of the semiconductor substrate.

The pixel isolation region 15 functions as a barrier so that the signal charges (electrons) are not moved to the adjacent photodiode PD. Furthermore, a p-type semiconductor region 19 is provided under the pixel isolation region 15 and the n-type semiconductor region 18 having a low impurity concentration so that the interface at the reverse surface side of these regions is not depleted.

As shown in FIG. 3 (which is a cross-sectional view taken along line III-III in FIG. 2), the pixel isolation region 15 is formed in a grid shape so as to surround the pixels 2 (photodiodes PD in the figure) to isolate the pixels 2.

In the method of producing a solid-state imaging device according to an embodiment of the present invention, an ion implantation method according to an embodiment of the present invention is applied to the formation of the pixel isolation region 15 composed of the p-type semiconductor region, which is deeply formed.

First Embodiment

Figure 4:
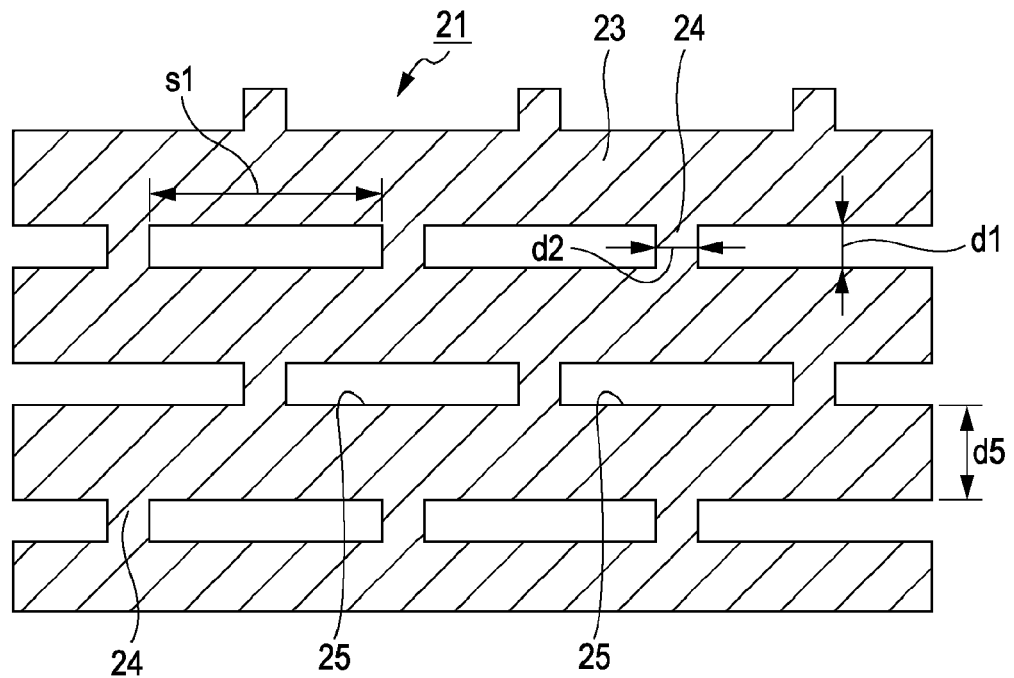
FIG. 4 is a plan view of a first ion implantation mask used in an ion implantation method and a method of producing a solid-state imaging device according to a first embodiment.
Figure 5:
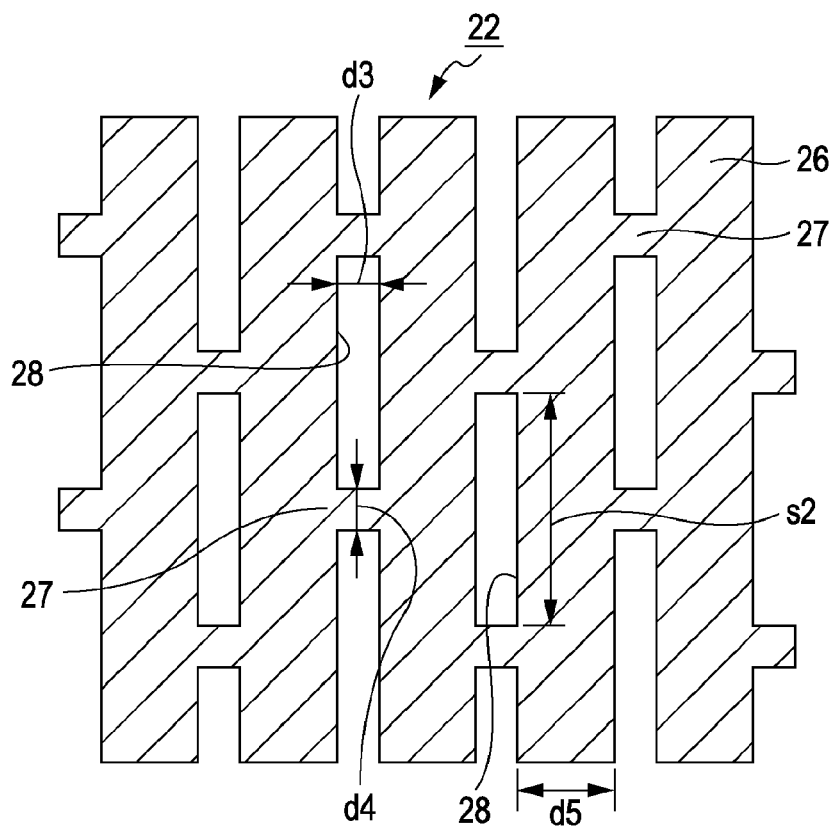
FIG. 5 is a plan view of a second ion implantation mask used in the ion implantation method and the method of producing a solid-state imaging device according to the first embodiment.

First Examples of Ion Implantation Method and Method of Producing Solid-State Imaging Device In an ion implantation method according to a first embodiment, an ion-implanted region having annular regions, specifically, an ion-implanted region having a grid shape in this embodiment, when viewed from the top surface, is formed at a deep position within a semiconductor substrate by performing ion implantation twice using a first ion implantation mask (i.e., first mask for ion implantation) 21 shown in FIG. 4 and a second ion implantation mask (i.e., second mask for ion implantation) 22 shown in FIG. 5. In a solid-state imaging device, this ion-implanted region corresponds to the pixel isolation region 15 composed of the p-type semiconductor region shown in FIG. 2. In this embodiment, resist masks are used as the first ion implantation mask 21 and the second ion implantation mask 22. Hereinafter, an ion implantation mask is referred to as resist mask.

Each of the first resist mask 21 and the second resist mask 22 is configured so that main mask portions are connected to each other with bridge portions to form openings corresponding to part of a grid-shaped region where ions are to be implanted. Specifically, as shown in FIG. 4, in the first resist mask 21, a plurality of strip-shaped main mask portions 23 extending in a certain direction, specifically, the horizontal direction in this embodiment, are arranged in parallel in the vertical direction, which intersects the horizontal direction, at predetermined intervals d1. The first resist mask 21 is configured so that adjacent stripe-shaped main mask portions 23 are connected to each other with first bridge portions 24, and a plurality of horizontally long first openings 25 are formed by the main mask portions 23 and the first bridge portions 24.

The predetermined width d1 of each of the horizontally long first openings 25 corresponds to a width of sides of the grid-shaped pixel isolation region (ion-implanted region) to be formed. The first bridge portions 24 are formed so that a width d2 of each of the first bridge portions 24 in the horizontal direction is the same as the width d1 of the first opening 25. A length s1 of each of the first openings 25 in the horizontal direction corresponds to a length of two pixels, and the first openings 25 are formed so as to correspond to part of the grid-shaped region where ions are to be implanted. The bridge portions 24 connecting adjacent main mask portions 23 to each other are evenly formed so that stresses applied to the bridge portions 24 are balanced with each other. In this embodiment, bridge portions 24 disposed at both sides of each strip-shaped main mask portion 23 are formed so as to be shifted in the horizontal direction by a ½ pitch with respect to each other. According to this structure, stresses applied to the bridge portions 24 are balanced with each other, and thus the main mask portions 23 are not deformed.

As shown in FIG. 5, in the second resist mask 22, a plurality of strip-shaped main mask portions 26 extending in a direction intersecting the above certain direction, specifically, the vertical direction in this embodiment, are arranged in parallel in the horizontal direction at predetermined intervals d3. The second resist mask 22 is configured so that adjacent stripe-shaped main mask portions 26 are connected to each other with second bridge portions 27, and a plurality of vertically long second openings 28 are formed by the main mask portions 26 and the second bridge portions 27.

The predetermined width d3 of each of the vertically long second openings 28 corresponds to a width of sides of the grid-shaped pixel isolation region (ion-implanted region) to be formed. The second bridge portions 27 are formed so that a width d4 of each of the second bridge portions 27 in the vertical direction is the same as the width d3 of the second opening 28. A length s2 of each of the second openings 28 in the vertical direction corresponds to a length of two pixels, and the second openings 28 are formed so as to correspond to part of the grid-shaped region where ions are to be implanted. The bridge portions 27 connecting adjacent main mask portions 26 to each other are evenly formed so that stresses applied to the bridge portions 27 are balanced with each other. In this embodiment, bridge portions 27 disposed at both sides of each strip-shaped main mask portion 26 are formed so as to be shifted in the vertical direction by a ½ pitch with respect to each other. According to this structure, stresses applied to the bridge portions 27 are balanced with each other, and thus the main mask portions 26 are not deformed.

A width d5 of each of the main mask portions 23 of the first resist mask 21 is equal to a width d5 of each of the main mask portions 26 of the second resist mask 22, and the width 5 corresponds to a width of one pixel (one photodiode PD in the figure).

The bridge portions 24 of the first resist mask 21 and the bridge portions 27 of the second resist mask 22 are formed to be complementary to each other. Herein, the phrase "formed to be complementary to each other" means that the first bridge portions 24 and the second bridge portions 27 do not overlap each other, and in regions corresponding to the bridge portions of one of the resist masks, an impurity is implanted by ion implantation using the other resist mask. More specifically, in regions corresponding the bridge portions 24 of the first resist mask 21, an impurity is implanted by ion implantation using the second resist mask 22, and in regions corresponding the bridge portions 27 of the second resist mask 22, the impurity is implanted by ion implantation using the first resist mask 21.

Figure 6A:
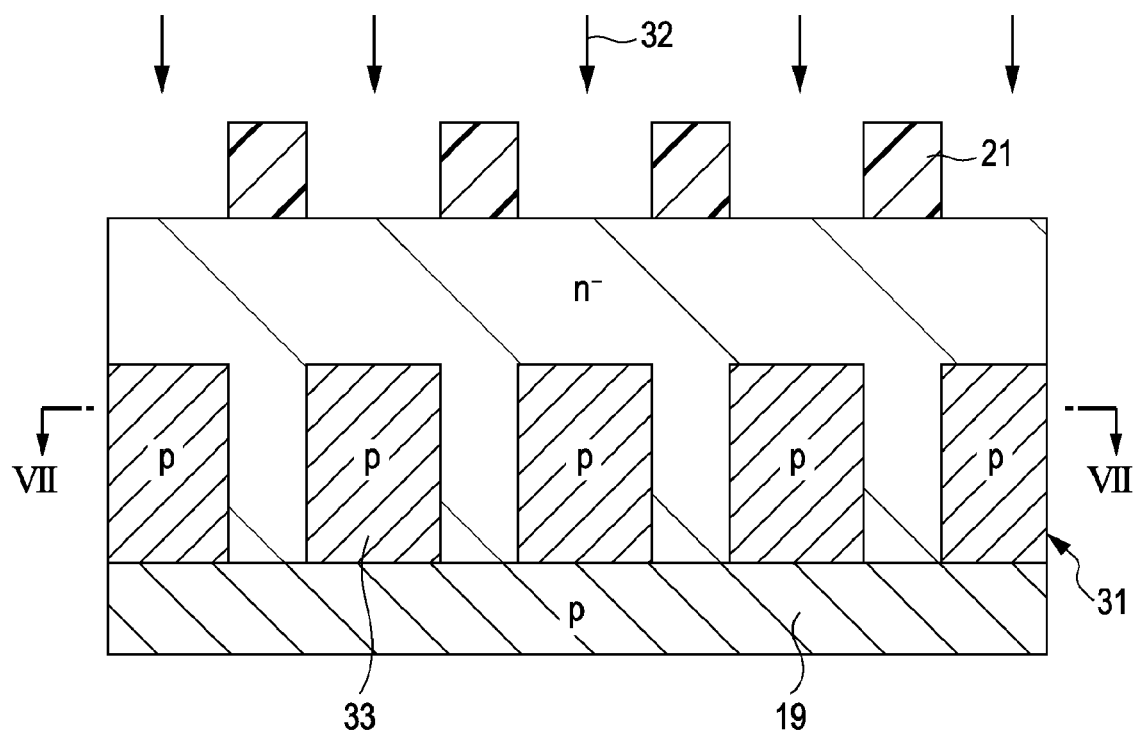
FIGS. 6A and 6B are production process views of the method of producing a solid-state imaging device according to the first embodiment.
Figure 7:
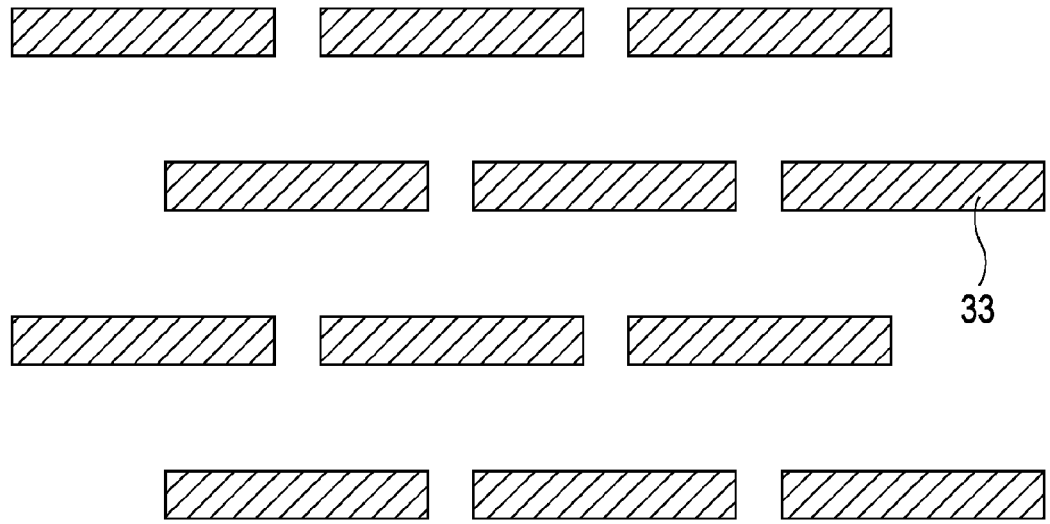
FIG. 7 is a plan view showing a first ion-implanted region formed using the first ion implantation mask according to the first embodiment.

In the first embodiment, first, as shown in FIG. 6A, the first resist mask 21 is formed on a semiconductor substrate 31 using a photolithographic technique. Next, an impurity of a first conductivity type, namely, boron 32, which is a p-type impurity, in this embodiment, is ion-implanted through the first resist mask 21 to form a first ion-implanted region 33. When the implantation energy in this step is set to, for example, the order of mega electron volts (MeV), the boron 32 can be ion-implanted to a deep position of the semiconductor substrate 31. When a cross section taken along line VII-VII of FIG. 6A is viewed, the first ion-implanted region 33 is formed in regions corresponding to the first openings 25 of the first resist mask 21, as shown in FIG. 7. Specifically, the first ion-implanted region 33 is formed as a plurality of horizontally long divided portions.

Figure 6B:
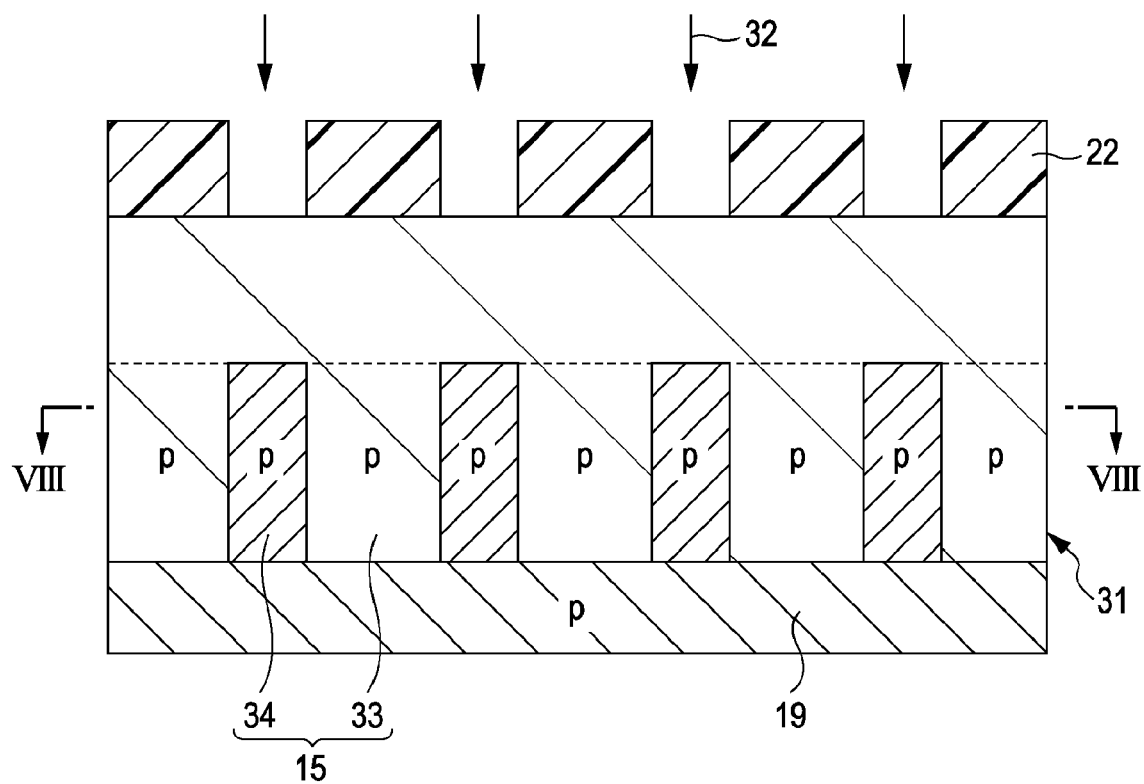
Figure 8:
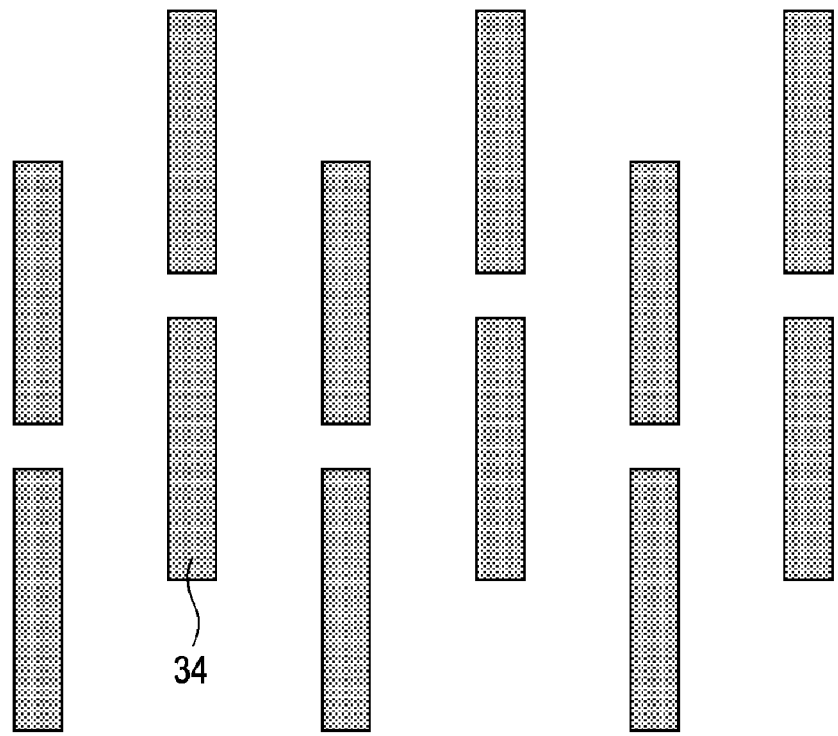
FIG. 8 is a plan view showing a second ion-implanted region formed using the second ion implantation mask according to the first embodiment.

Next, as shown in FIG. 6B, the first resist mask 21 is removed, and the second resist mask 22 is formed on the semiconductor substrate 31 using a photolithographic technique. Next, the impurity of the first conductivity type, namely, boron 32, which is a p-type impurity, in this embodiment, is ion-implanted through the second resist mask 22 to form a second ion-implanted region 34. The implantation energy of boron 32 in this step is controlled to be the same as the implantation energy in the step shown in FIG. 6A so that the second ion-implanted region 34 is formed at the same depth position as that of the first ion-implanted region 33. The concentration of boron introduced by ion implantation using the second resist mask 22 is controlled to be the same as the concentration of boron introduced by ion implantation using the first resist mask 21. When a cross section of only the second ion-implanted region 34 taken along line VIII-VIII of FIG. 6B is viewed, the second ion-implanted region 34 is formed in regions corresponding to the second openings 28 of the second resist mask 22, as shown in FIG. 8. Specifically, the second ion-implanted region 34 is formed as a plurality of vertically long divided portions.

Figure 9:
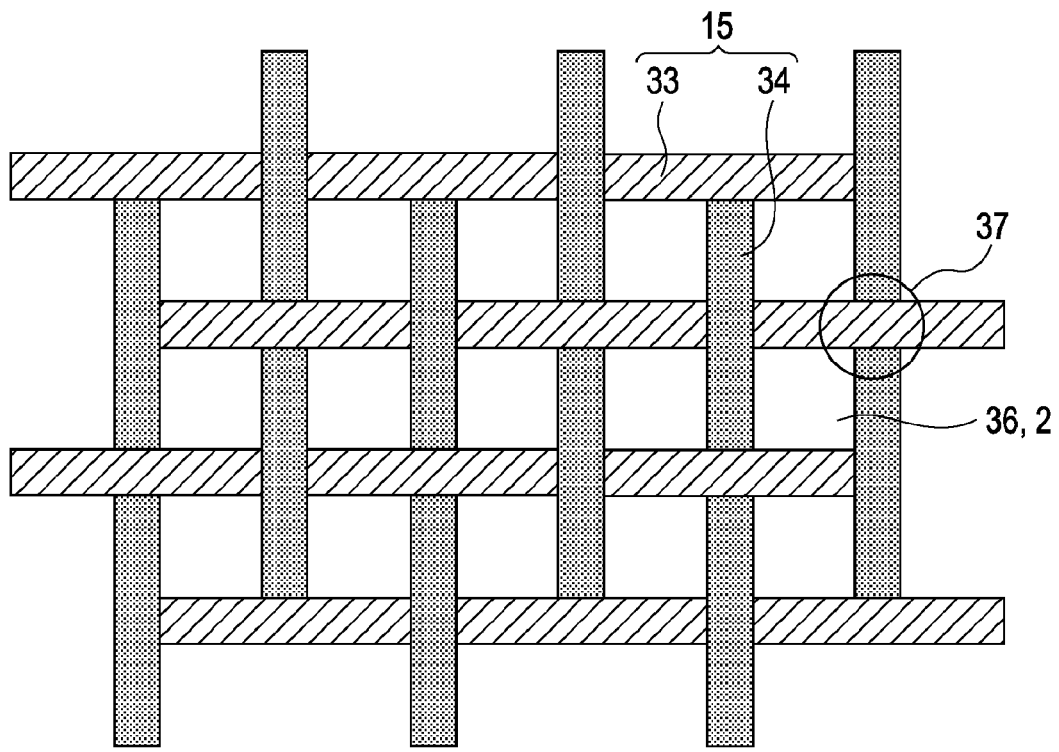
FIG. 9 is a plan view showing a grid-shaped pixel isolation region formed by combining the first ion-implanted region with the second ion-implanted region according to the first embodiment.

The first ion-implanted region 33 and the second ion-implanted region 34 are combined, and as shown in FIG. 9, a grid-shaped pixel isolation region (ion-implanted region) 15 is formed so as to surround regions 36 where pixels 2 are formed.

The ion implantation of boron 32 may be performed a plurality of times using the same resist mask. For example, a desired ion-implanted region may be formed by performing ion implantation three times using the same mask.

In the subsequent steps, in the pixel portion, photodiodes PD, a p-type semiconductor well region 14, pixel transistors etc. are formed, and a multilayer wiring layer in which multilayer wirings are formed with interlayer insulating films therebetween is further formed by ordinary methods. Furthermore, in the case of a surface irradiation-type device, a planarizing film is formed on the multilayer wiring layer, and a color filter, an on-chip microlens etc. are further formed on the planarizing film. In the case of a rear-surface irradiation-type device, a color filter, an on-chip microlens etc. are formed on a rear surface of the substrate, the rear surface being disposed opposite the surface having the multilayer wiring layer thereon. Meanwhile, in the peripheral circuit portion, the control circuit, the column signal-processing circuits, the vertical drive circuit, the horizontal drive circuit, the output circuit etc., all of which are shown in FIG. 1, are formed. Thus, a desired solid-state imaging device is obtained.

According to the ion implantation method and the method of producing a solid-state imaging device of the first embodiment, the first resist mask 21 has a pattern shape in which the main mask portions 23 are connected to each other with the bridge portions 24, and the second resist mask 22 has a pattern shape in which the main mask portions 26 are connected to each other with the bridge portions 27. Accordingly, even when the first resist mask 21 and the second resist mask 22 are formed as fine patterns, the resist masks 21 and 22 function as ion implantation masks which are stable and in which the problem of falling over does not occur. In the first resist mask 21 and the second resist mask 22, the bridge portions 24 and 27 are evenly formed so that stresses applied to the bridge portions 24 and 27 are balanced with each other, respectively. Accordingly, an unnecessary force is not applied to the main mask portions 23 and 26, and thus a normal state can be maintained.

Furthermore, the bridge portions 24 of the first resist mask 21 and the bridge portions 27 of the second resist mask 22 are formed to be complementary to each other. Accordingly, ion implantation is performed once over the entire area of the grid-shaped pixel isolation region (ion-implanted region) 15, thus forming the grid-shaped pixel isolation region 15 having a uniform impurity concentration. More specifically, a corner portion 37 of the grid shown in FIG. 9 also undergoes the ion implantation once. Although the ion implantation step is performed twice, each portion of the grid-shaped pixel isolation region 15 undergoes ion implantation once. Consequently, the generation of defects can be suppressed as compared with the method in the related art in which ion implantation is performed twice.

Figure 10:
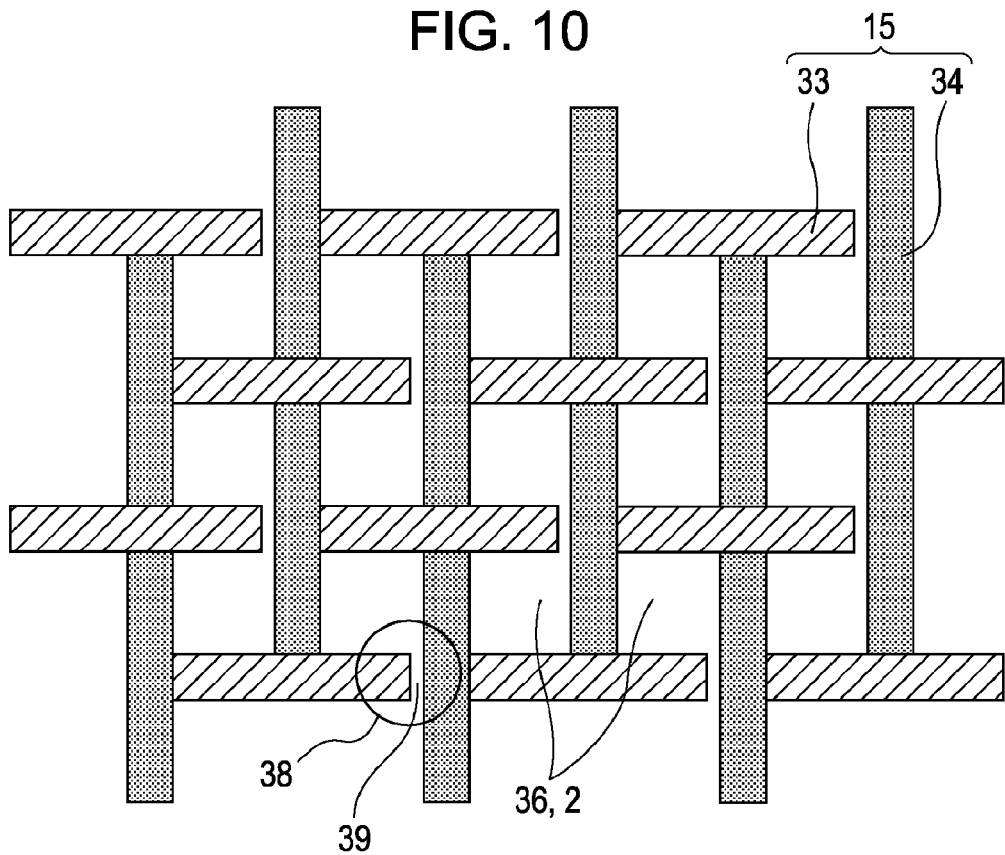
FIG. 10 is a plan view showing a pixel isolation region in the case where misalignment occurs in the first embodiment.

In the first embodiment, the first resist mask 21 and the second resist mask 22 are formed using a photolithographic technique twice. FIG. 10 shows a case where mask misalignment occurs in the photolithography. As shown in FIG. 10, because of the mask misalignment, positions of the first ion-implanted region 33 and second ion-implanted region 34 are shifted, and a small clearance 39 is formed in a portion 38. However, the first embodiment is advantageous in that the positions are merely slightly shifted and the regions 36 where adjacent pixels 2 are formed are the same as each other.

Second Embodiment

Figure 11:
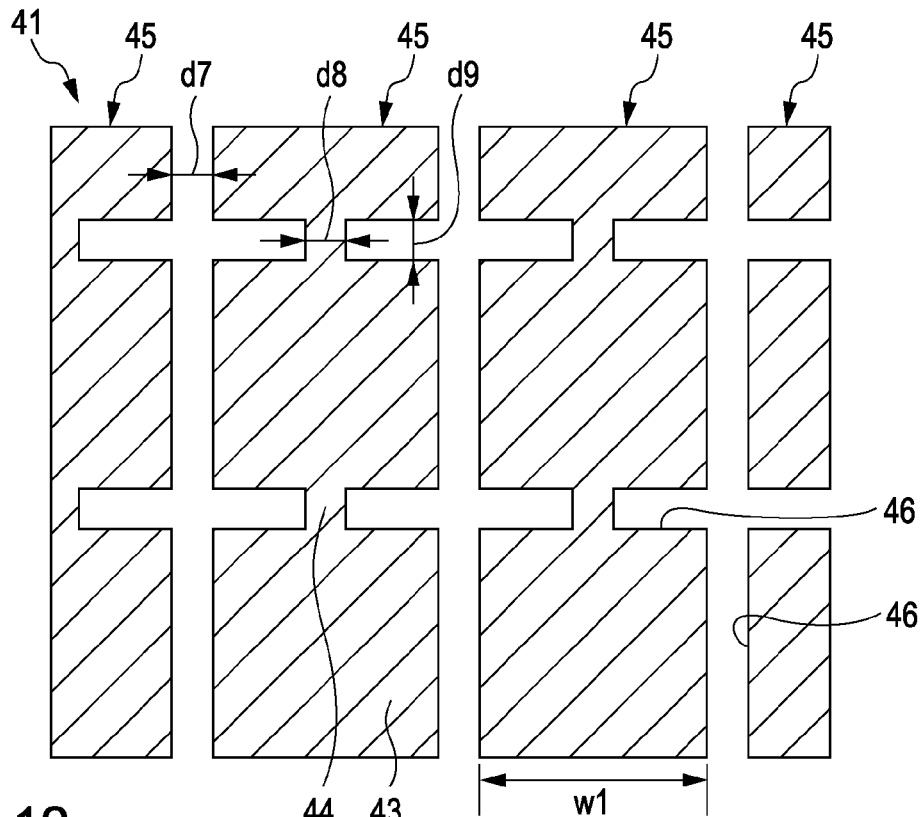
FIG. 11 is a plan view of a first ion implantation mask used in an ion implantation method and a method of producing a solid-state imaging device according to a second embodiment.
Figure 12:
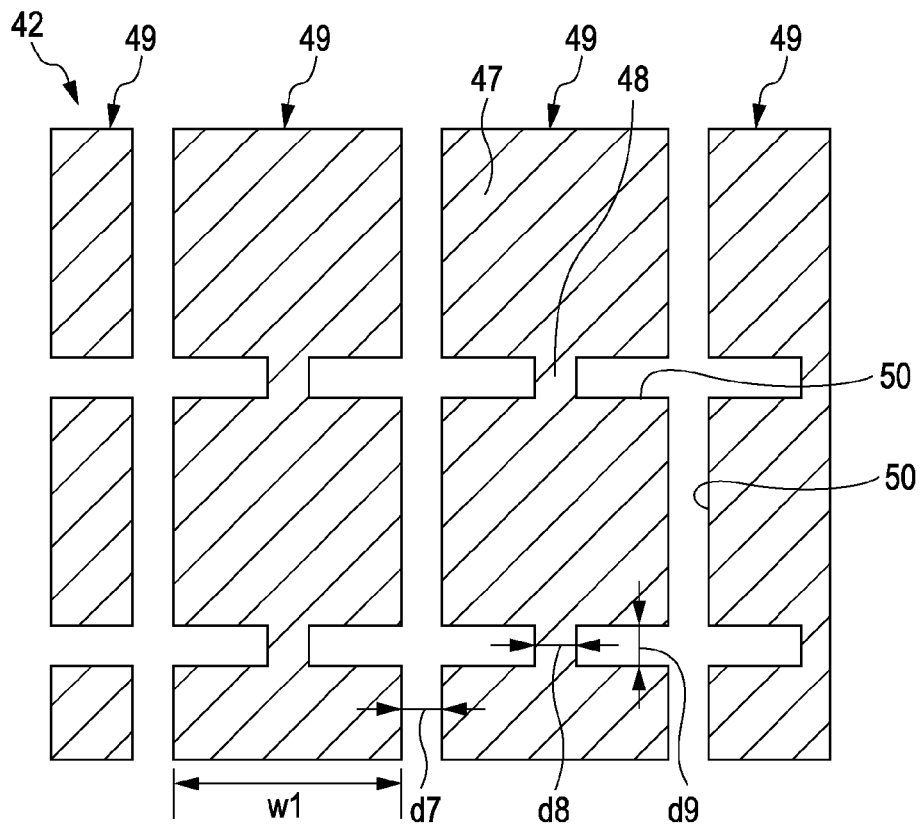
FIG. 12 is a plan view of a second ion implantation mask used in the ion implantation method and the method of producing a solid-state imaging device according to the second embodiment.

Second Examples of Ion Implantation Method and Method of Producing Solid-State Imaging Device In an ion implantation method according to a second embodiment, an ion-implanted region having annular regions, specifically, an ion-implanted region having a grid shape in this embodiment, when viewed from the top surface, is formed at a deep position within a semiconductor substrate by performing ion implantation twice using a first ion implantation mask 41 shown in FIG. 11 and a second ion implantation mask 42 shown in FIG. 12. In a solid-state imaging device, this ion-implanted region corresponds to the pixel isolation region 15 composed of the p-type semiconductor region shown in FIG. 2. In this embodiment, resist masks are used as the first ion implantation mask 41 and the second ion implantation mask 42. Hereinafter, an ion implantation mask is referred to as resist mask.

Each of the first resist mask 41 and the second resist mask 42 is configured so that a plurality of strip-shaped portions in which a plurality of main mask portions are connected to each other with bridge portions are arranged in parallel to form openings corresponding to part of the grid-shaped region where ions are to be implanted.

Specifically, as shown in FIG. 11, the first resist mask 41 is constituted by arranging a plurality of strip-shaped portions 45. Each of the strip-shaped portions 45 is constituted by connecting a plurality of rectangular, namely, square in this embodiment, main mask portions 43, each of which has a width w1 corresponding to two pixels, to each other with bridge portions 44. Each of the bridge portions 44 is disposed at a central portion of a side of the main mask portion 43, and the strip-shaped portions 45 are formed so as to extend in a certain direction, namely, in the vertical direction in the figure. The plurality of strip-shaped portions 45 are arranged in parallel at predetermined intervals d7 in a direction intersecting the certain direction, namely, in the horizontal direction in the figure. A width d8 and a length d9 of each of the bridge portions 44 are set to be the same as the width d7. First openings 46 corresponding to part of the grid-shaped region where ions are to be implanted are formed between the main mask portions 43 connected to each other with the bridge portions 44 and between adjacent strip-shaped portions 45.

The widths d7 and d9, which correspond to widths of the first openings 46, correspond to widths of sides of the grid-shaped pixel isolation region (ion-implanted region) to be formed. In the first resist mask 41, the bridge portions 44 connecting between the main mask portions 43 are formed in a vertically symmetric manner with respect to the main mask portions 43 and formed so that the stresses applied to the bridge portions 44 are balanced with each other.

As shown in FIG. 12, as in the first resist mask 41, the second resist mask 42 is constituted by arranging a plurality of strip-shaped portions 49. Each of the strip-shaped portions 49 is constituted by connecting a plurality of rectangular, namely, square in this embodiment, main mask portions 47, each of which has a width w1 corresponding to two pixels, to each other with bridge portions 48. Each of the bridge portions 48 is disposed at a central portion of a side of the main mask portion 47, and the strip-shaped portions 49 are formed so as to extend in a certain direction, namely, in the vertical direction in the figure. The plurality of strip-shaped portions 49 are arranged in parallel at predetermined intervals d7 in a direction intersecting the certain direction, namely, in the horizontal direction in the figure. A width d8 and a length d9 of each of the bridge portions 48 are set to be the same as the width d7.

In this second resist mask 42, the structure of the strip-shaped portions 49 themselves are the same as the structure of the strip-shaped portions 45 of the first resist mask 41. However, in particular, the bridge portions 48 are formed so as to be shifted with respect to the bridge portions 44 of the first resist mask 41 in the vertical direction by a ½ pitch. Second openings 50 corresponding to part of the grid-shaped region where ions are to be implanted are formed between the main mask portions 47 connected to each other with the bridge portions 48 and between adjacent strip-shaped portions 49.

The widths d7 and d9, which correspond to widths of the second openings 50, correspond to widths of sides of the grid-shaped pixel isolation region (ion-implanted region) to be formed. In the second resist mask 42, the bridge portions 48 connecting between the main mask portions 47 are formed in a vertically symmetric manner with respect to the main mask portions 47 and formed so that the stresses applied to the bridge portions 48 are balanced with each other.

As in the first embodiment, the bridge portions 44 of the first resist mask 41 and the bridge portions 48 of the second resist mask 42 are formed to be complementary to each other.

Figure 13A:
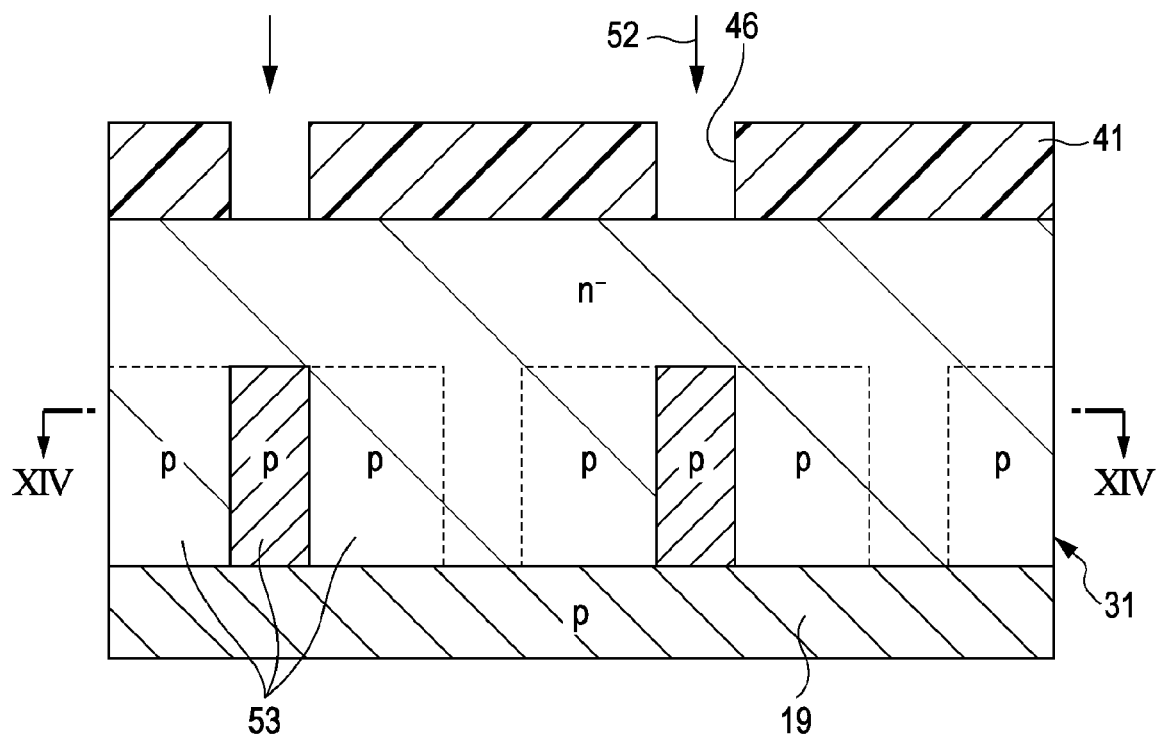
FIGS. 13A and 13B are production process views of the method of producing a solid-state imaging device according to the second embodiment.
Figure 14:
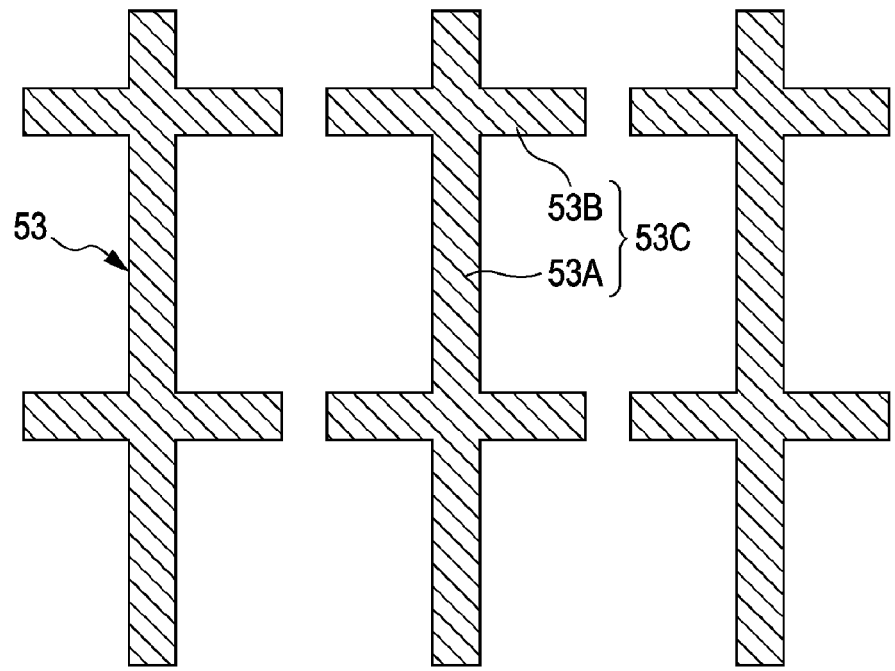
FIG. 14 is a plan view showing a first ion-implanted region formed using the first ion implantation mask according to the second embodiment.

In the second embodiment, first, as shown in FIG. 13A, the first resist mask 41 is formed on a semiconductor substrate 31 using a photolithographic technique. Next, an impurity of a first conductivity type, namely, boron 52, which is a p-type impurity, in this embodiment, is ion-implanted through the first resist mask 41 to form a first ion-implanted region 53. When the implantation energy in this step is set to, for example, the order of mega electron volts (MeV), the boron 52 can be ion-implanted in a deep position of the semiconductor substrate 31. When a cross section taken along line XIV-XIV of FIG. 13A is viewed, the first ion-implanted region 53 is formed in regions corresponding to the first openings 46 of the first resist mask 41, as shown in FIG. 14.

The first ion-implanted region 53 is formed as a plurality of divided portions so as to partly surround regions each corresponding to 2×2 pixels. More specifically, a plurality of regions 53C each including a region 53A and regions 53B are separately formed. The region 53A extends in the vertical direction. Each of the regions 53B continuously extends from the region 53A in the horizontal direction at a pitch corresponding to two pixels. The region 53B symmetrically extends so that each of portions extending on the right side and the left side has a length corresponding to one pixel.

Figure 13B:
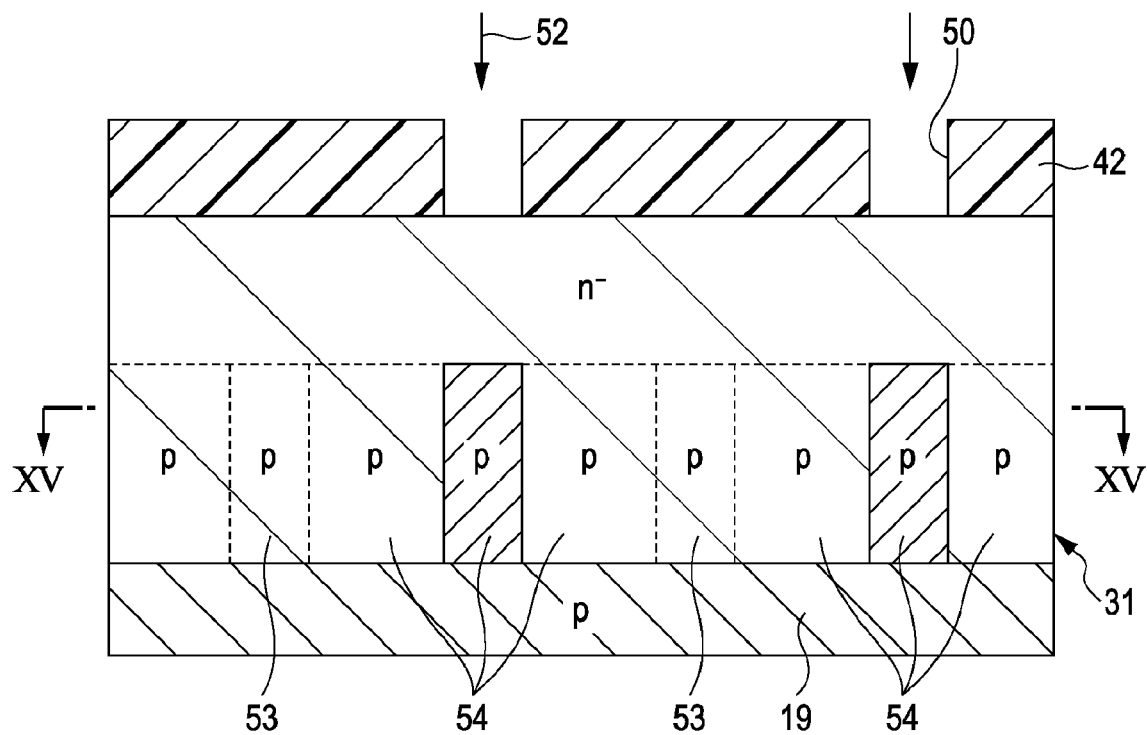

Next, as shown in FIG. 13B, the first resist mask 41 is removed, and the second resist mask 42 is formed on the semiconductor substrate 31 using a photolithographic technique. In this step, the second resist mask 42 is formed so that the second openings 50 are shifted with respect to the first openings 46 of the first resist mask 41 by a ½ pitch in the vertical direction and by a ½ pitch in the horizontal direction. Next, the impurity of the first conductivity type, namely, boron 52, which is a p-type impurity, in this embodiment, is ion-implanted through the second resist mask 42 to form a second ion-implanted region 54. The implantation energy of boron 52 in this step is controlled to be the same as the implantation energy in the step shown in FIG. 13A so that the second ion-implanted region 54 is formed at the same depth position as that of the first ion-implanted region 53. The concentration of boron introduced by ion implantation using the second resist mask 42 is controlled to be the same as the concentration of boron introduced by ion implantation using the first resist mask 41.

Figure 15:
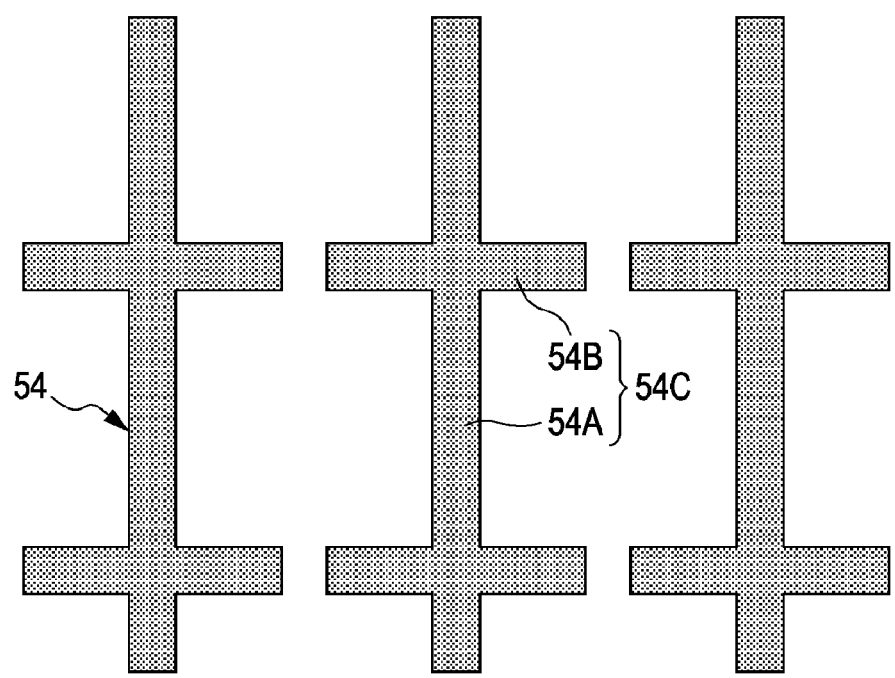
FIG. 15 is a plan view showing a second ion-implanted region formed using the second ion implantation mask according to the second embodiment.

When a cross section of only the second ion-implanted region 54 taken along line XV-XV of FIG. 13B is viewed, the second ion-implanted region 54 is formed in regions corresponding to the second openings 50 of the second resist mask 42, as shown in FIG. 15. The second ion-implanted region 54 is formed as a plurality of divided portions so as to partly surround regions each corresponding to 2×2 pixels. More specifically, a plurality of regions 54C each including a region 54A and regions 54B are separately formed. The region 54A extends in the vertical direction. Each of the regions 54B continuously extends from the region 54A in the horizontal direction at a pitch corresponding to two pixels. The region 54B symmetrically extends so that each of portions extending on the right side and the left side has a length corresponding to one pixel. In this step, the second ion-implanted region 54 is formed so that the regions 54A thereof are shifted with respect to the regions 53A of the first ion-implanted region 53 in the horizontal direction by a ½ pitch, and the regions 54B thereof are shifted with respect to the regions 53B of the first ion-implanted region 53 in the vertical direction by a ½ pitch.

Figure 16:
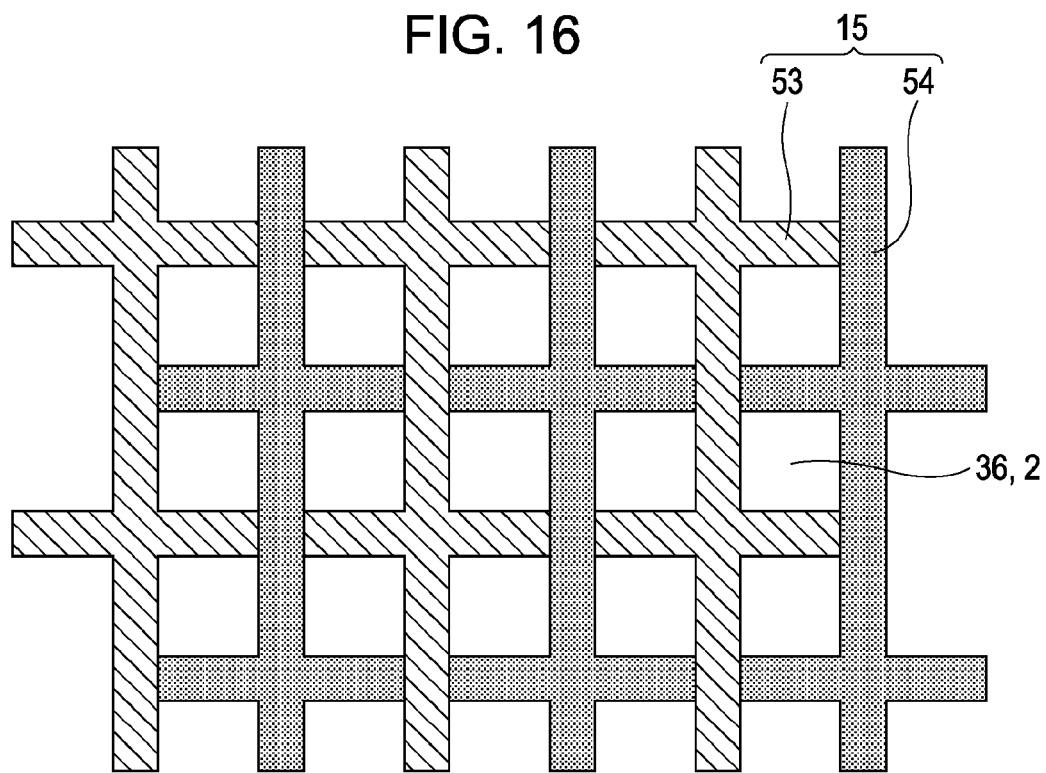
FIG. 16 is a plan view showing a grid-shaped pixel isolation region formed by combining the first ion-implanted region with the second ion-implanted region according to the second embodiment.

The first ion-implanted region 53 and the second ion-implanted region 54 are combined, and as shown in FIG. 16, a grid-shaped pixel isolation region (ion-implanted region) 15 is formed so as to surround regions 36 where pixels 2 are formed.

In the subsequent steps, in the pixel portion, photodiodes PD, a p-type semiconductor region 14, pixel transistors etc. are formed, and a multilayer wiring layer in which multilayer wirings are formed with interlayer insulating films therebetween is further formed by ordinary methods. Furthermore, in the case of a surface irradiation-type device, a planarizing film is formed on the multilayer wiring layer, and a color filter, an on-chip microlens etc. are further formed on the planarizing film. In the case of a rear-surface irradiation-type device, a color filter, an on-chip microlens etc. are formed on a rear surface of the substrate, the rear surface being disposed opposite the surface having the multilayer wiring layer thereon. Meanwhile, in the peripheral circuit portion, the control circuit, the column signal-processing circuits, the vertical drive circuit, the horizontal drive circuit, the output circuit etc., all of which are shown in FIG. 1, are formed. Thus, a desired solid-state imaging device is obtained.

According to the ion implantation method and the method of producing a solid-state imaging device of the second embodiment, the first resist mask 41 has a pattern shape in which the main mask portions 43 are connected to each other with the bridge portions 44, and the second resist mask 42 has a pattern shape in which the main mask portions 47 are connected to each other with the bridge portions 48. Accordingly, even when the first resist mask 41 and the second resist mask 42 are formed as fine patterns, the resist masks 41 and 42 function as ion implantation masks which are stable and in which the problem of falling over does not occur. In the first resist mask 41 and the second resist mask 42, the bridge portions 44 and 48 are evenly formed so that stresses applied to the bridge portions 44 and 48 are balanced with each other, respectively. Accordingly, an unnecessary force is not applied to the main mask portions 43 and 47, and thus a normal state can be maintained.

Furthermore, the bridge portions 44 of the first resist mask 41 and the bridge portions 48 of the second resist mask 42 are formed to be complementary to each other. Accordingly, ion implantation is performed once over the entire area of the grid-shaped pixel isolation region (ion-implanted region) 15, thus forming the grid-shaped pixel isolation region 15 having a uniform impurity concentration. Although the ion implantation step is performed twice, each portion of the grid-shaped pixel isolation region 15 undergoes ion implantation once. Consequently, the generation of defects can be suppressed as compared with the method in the related art in which ion implantation is performed twice.

In the second embodiment, except for the bridge portions, the minimum width w1 of the main mask portions 43 and 47 is two times or more as compared with the first embodiment. Accordingly, the second embodiment is advantageous in that it can be applied to a finer mask pattern. However, the main mask portions 43 and 47 are connected to each other only in the vertical direction (longitudinal direction). Accordingly, when the pixel pitch is decreased to half or less, the problem of falling over may occur. The bridge portions may not be necessarily formed so as to completely complementary to each other. The number of bridge portions may be somewhat increased in consideration of a sufficient condition for practical use, and bridge portions that partly connect the main mask portions to each other in the horizontal direction (transverse direction) may also be provided.

Figure 17:
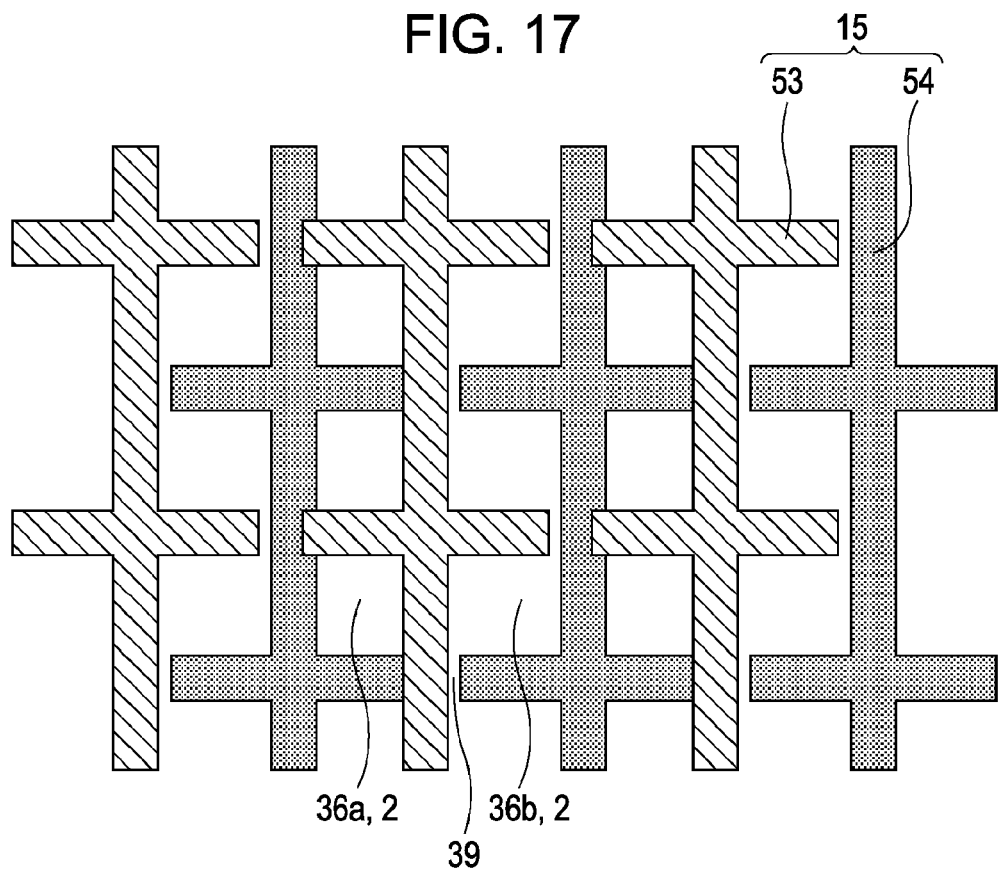
FIG. 17 is a plan view showing a pixel isolation region in the case where misalignment occurs in the second embodiment.

In the second embodiment, the first resist mask 41 and the second resist mask 42 are formed using a photolithographic technique twice. FIG. 17 shows a case where mask misalignment occurs in the photolithography. As shown in FIG. 17, because of the mask misalignment, positions of the first ion-implanted region 53 and second ion-implanted region 54 are shifted in the horizontal direction, and a small clearance 39 is formed. In this case, adjacent regions 36a and 36b surrounded by the pixel isolation regions 15 are different from each other. The second embodiment is disadvantageous in this point, as compared with the first embodiment.

Third Embodiment

Third Examples of Ion Implantation Method and Method of Producing Solid-State Imaging Device As shown in FIGS. 10 and 17, in the cases of the first and second embodiments, when optical masks for forming the first resist mask and the second resist mask are exactly and accurately made, a clearance corresponding to the amount of mask misalignment may be formed. In reality, diffusion of an ion occurs after ion implantation, and thus the size of the clearance decreases. However, preferably, the first resist mask and the second resist mask are formed so as to have overlapping portions so that the first ion-implanted region and the second ion-implanted region are formed to overlap each other to some extent.

Figure 18:
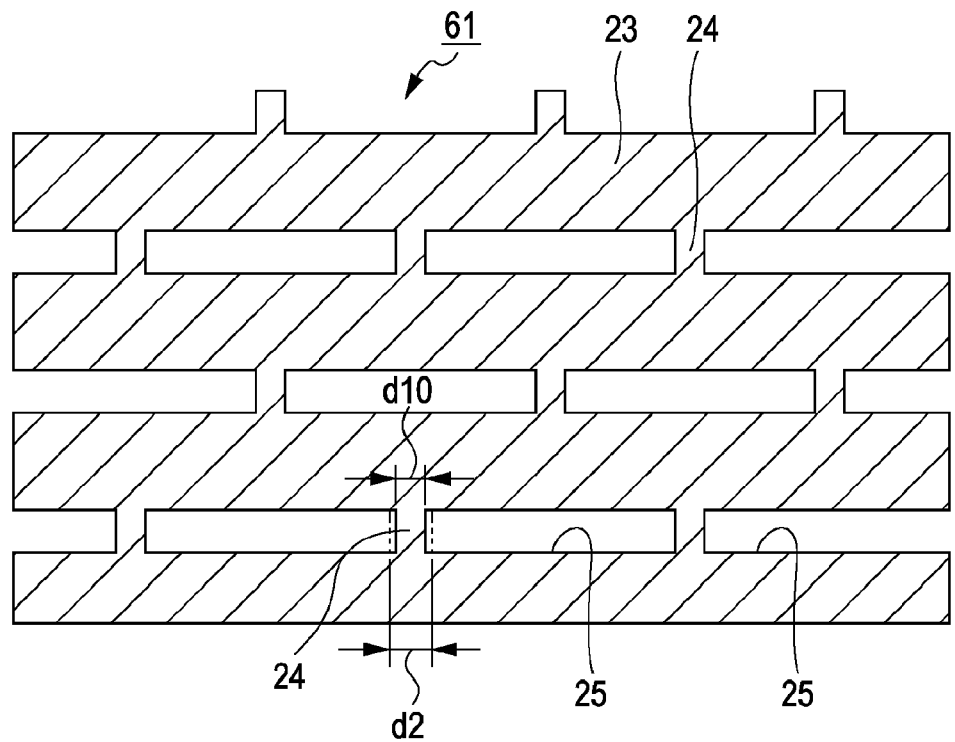
FIG. 18 is a plan view of a first ion implantation mask used in an ion implantation method and a method of producing a solid-state imaging device according to a third embodiment.
Figure 19:
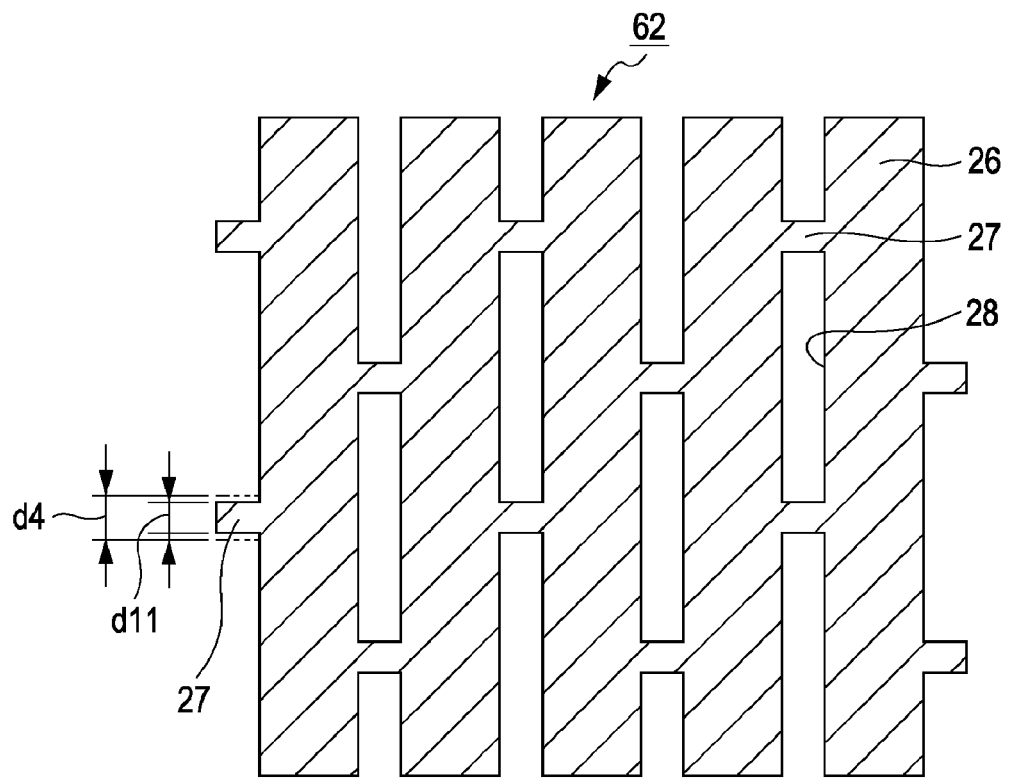
FIG. 19 is a plan view of a second ion implantation mask used in the ion implantation method and the method of producing a solid-state imaging device according to the third embodiment.

A third embodiment is configured so that ion implantation masks are formed so as to have overlapping portions. For example, in the case of first and second resist mask patterns similar to those of the first embodiment, as shown in FIGS. 18 and 19, a first resist mask 61 and a second resist mask 62 that include bridge portions having a reduced width are formed. That is, bridge portions 24 of the first resist mask 61 and bridge portions 27 of the second resist mask 62 are formed so as to have a small width to an extent that the amount of misalignment of the first resist mask 61 and the second resist mask 62 can be compensated for.

More specifically, as shown in FIG. 18, in the first resist mask 61, a width d10 of each first bridge portion 24 is smaller than the width d2 shown in FIG. 4 (d10<d2). Other structures are the same as those described with reference to FIG. 4. Accordingly, parts corresponding to those in FIG. 4 are assigned the same reference numerals, and an overlapping description thereof is omitted. As shown in FIG. 19, in the second resist mask 62, a width d11 of each second bridge portion 27 is smaller than the width d4 shown in FIG. 5 (d11<d4). Other structures are the same as those described with reference to FIG. 5. Accordingly, parts corresponding to those in FIG. 5 are assigned the same reference numerals, and an overlapping description thereof is omitted.

Figure 20:
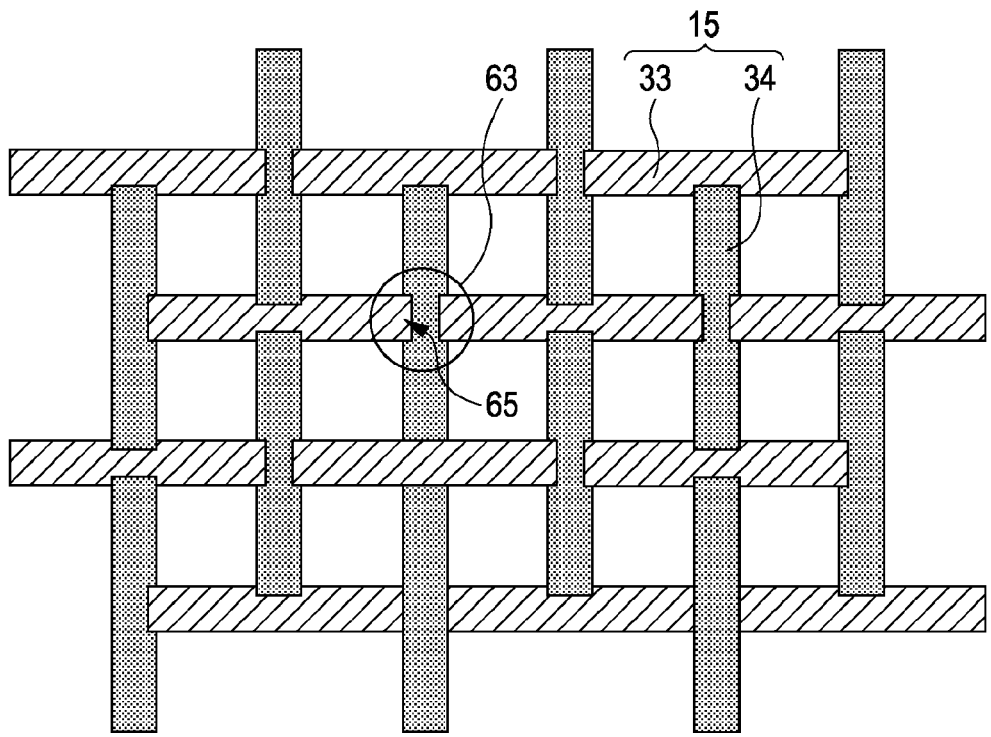
FIG. 20 is a plan view showing a grid-shaped pixel isolation region formed by combining a first ion-implanted region with a second ion-implanted region according to the third embodiment.

FIG. 20 shows a pixel isolation region 15 composed of a first ion-implanted region 33 and a second ion-implanted region 34 obtained by performing ion implantation using the first resist mask 61 and the second resist mask 62, respectively, of the third embodiment. As shown in FIG. 20, the pixel isolation region 15 is formed so that the first ion-implanted region 33 and the second ion-implanted region 34 partly overlap between overlapping portions 65 in each intersecting portion 63 of a grid.

Accordingly, according to the third embodiment, even if misalignment in the horizontal direction occurs in the formation of the first resist mask 61 and the second resist mask 62, a clearance is not formed because of the presence of the overlapping portions 65. Other advantages the same as those described in the first embodiment are also achieved in this embodiment.

Although not shown in the figure, for example, also in the case where first and second resist mask patterns similar to those in the second embodiment are used, the width d8 of each bridge portion 44 of the first resist mask 41 shown in FIG. 11, and the width d8 of each bridge portion 48 of the second resist mask 42 shown in FIG. 12 are decreased. Thus, the same advantage as that of the third embodiment described with reference to FIGS. 18 to 20 can be achieved.

Figure 21:
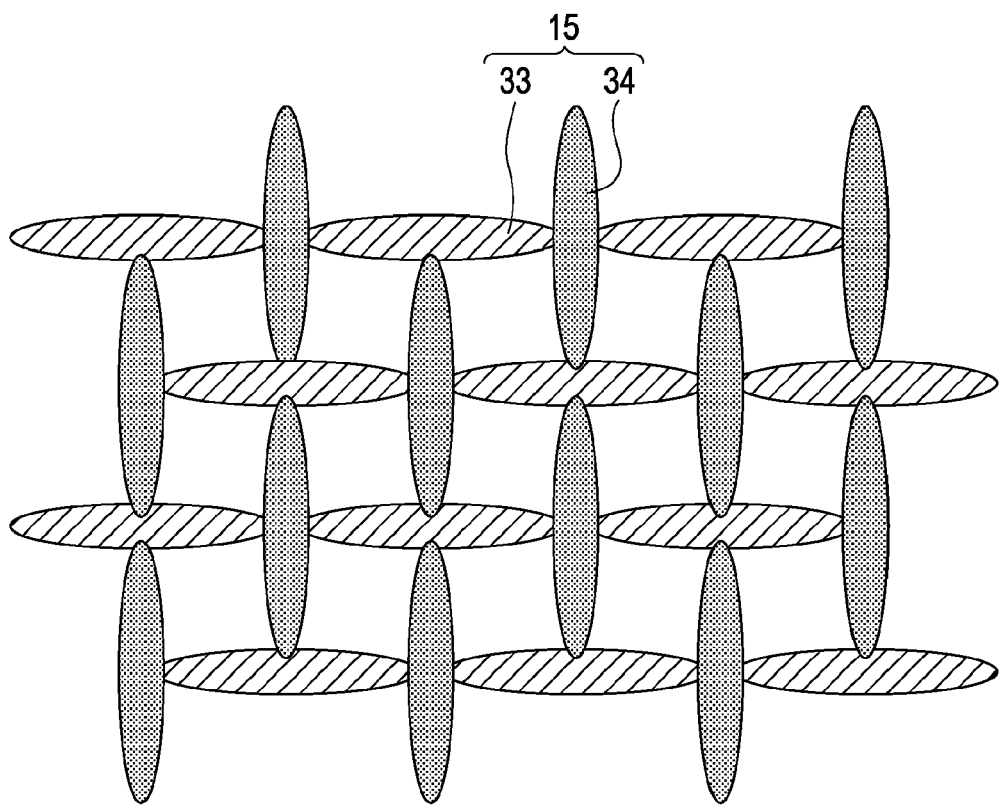
FIG. 21 is a plan view showing a grid-shaped pixel isolation region formed by combining the first ion-implanted region with the second ion-implanted region in the case where each of the ion implantation masks according to the first embodiment has rounded corners.
Figure 22:
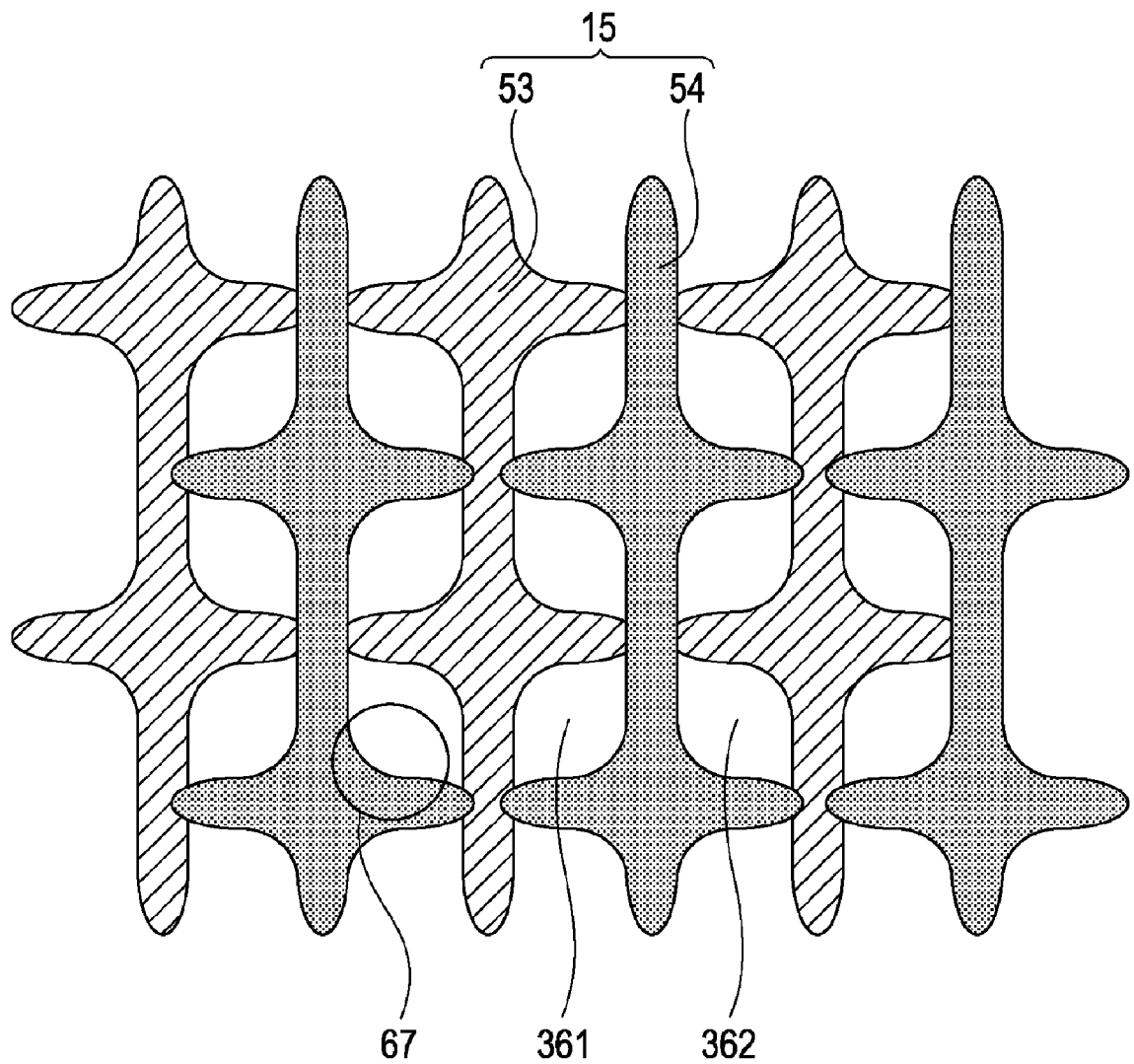
FIG. 22 is a plan view showing a grid-shaped pixel isolation region formed by combining the first ion-implanted region with the second ion-implanted region in the case where each of the ion implantation masks according to the second embodiment has rounded corners.

In reality, when a resist mask has a fine pattern, roundness of corners of the resist mask is not negligible. Each of FIGS. 21 and 22 shows a grid-shaped pixel isolation region 15 formed by performing ion implantation using resist masks having a pattern including rounded corners. FIG. 21 shows a pattern of a pixel isolation region composed of first and second ion-implanted regions formed when each of the first and second resist masks in the above-described first embodiment has a pattern including rounded corners. FIG. 22 shows a pattern of a pixel isolation region composed of first and second ion-implanted regions formed when each of the first and second resist masks in the above-described second embodiment has a pattern including rounded corners.

In the example shown in FIG. 22, in an arrangement of 2×2 pixels, the shapes of respective regions 36 are symmetrical, but the shapes (orientations) of the regions 36 surrounded by the grid-shaped pixel isolation regions 15 are different from each other. For example, a region 361 and a region 362 differ in shape (orientation). Furthermore, when a corner 67 is rounded, the area of each region 36 surrounded by the grid-shaped pixel isolation region 15 is invaded and decreased.

In contrast, in the example shown in FIG. 21, the shapes of respective regions 36 surrounded by the grid-shaped pixel isolation regions 15 can be the same. In addition, this example is advantageous in that, for example, invasion of the area of each region 36 due to the effect of the roundness of the resist mask does not occur and thus the area of the region 36 is not decreased.

A primary function of the above-described bridge portions of the resist mask is to support the main mask portions so that the main mask portions do not fall over, and thus the width of each of the bridge portions may be small. When the bridge portions have a small width, the above-mentioned overlapping portions, which are used as a measure to compensate for misalignment, can be ensured. Consequently, a resist masks or pixel isolation region that is resistant to misalignment can be formed.

Fourth Embodiment

Configuration Example of Solid-State Imaging Device

A solid-state imaging device according to this embodiment is a solid-state imaging device produced by employing any of the production methods according to the embodiments described above. According to the solid-state imaging device of this embodiment, even when the pixel size is reduced, a highly accurate pixel isolation region and pixels having uniform pixel characteristics can be formed, and a solid-state imaging device with high quality can be provided.

Fifth Embodiment

Configuration Example of Electronic Apparatus

The solid-state imaging device according to an embodiment of the present invention can be applied to electronic apparatuses such as a camera equipped with a solid-state imaging device, a camera cell phone, and other apparatuses equipped with a solid-state imaging device. In particular, since fine pixels can be formed, a camera equipped with a compact solid-state imaging device can be produced.

Figure 23:
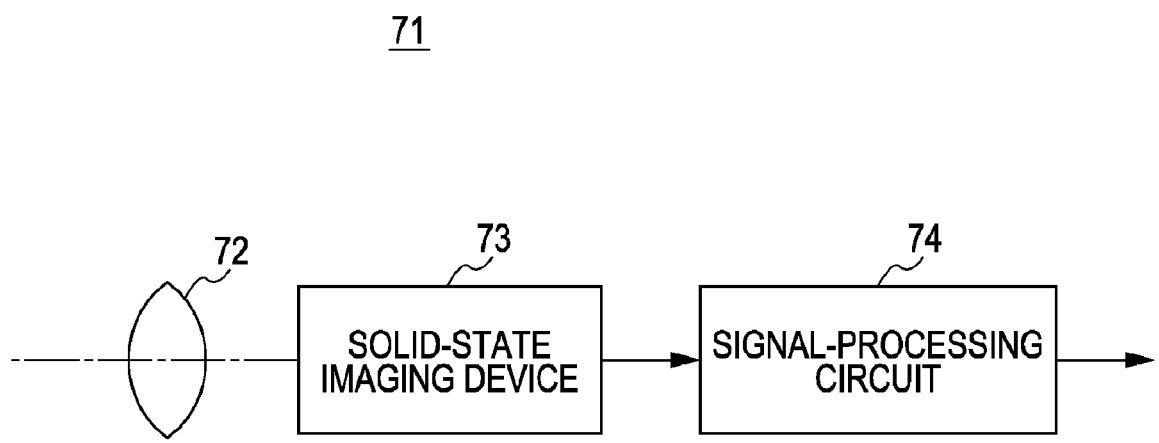
FIG. 23 is a schematic structural diagram showing an electronic apparatus according an embodiment of the present invention.
Figure 24:
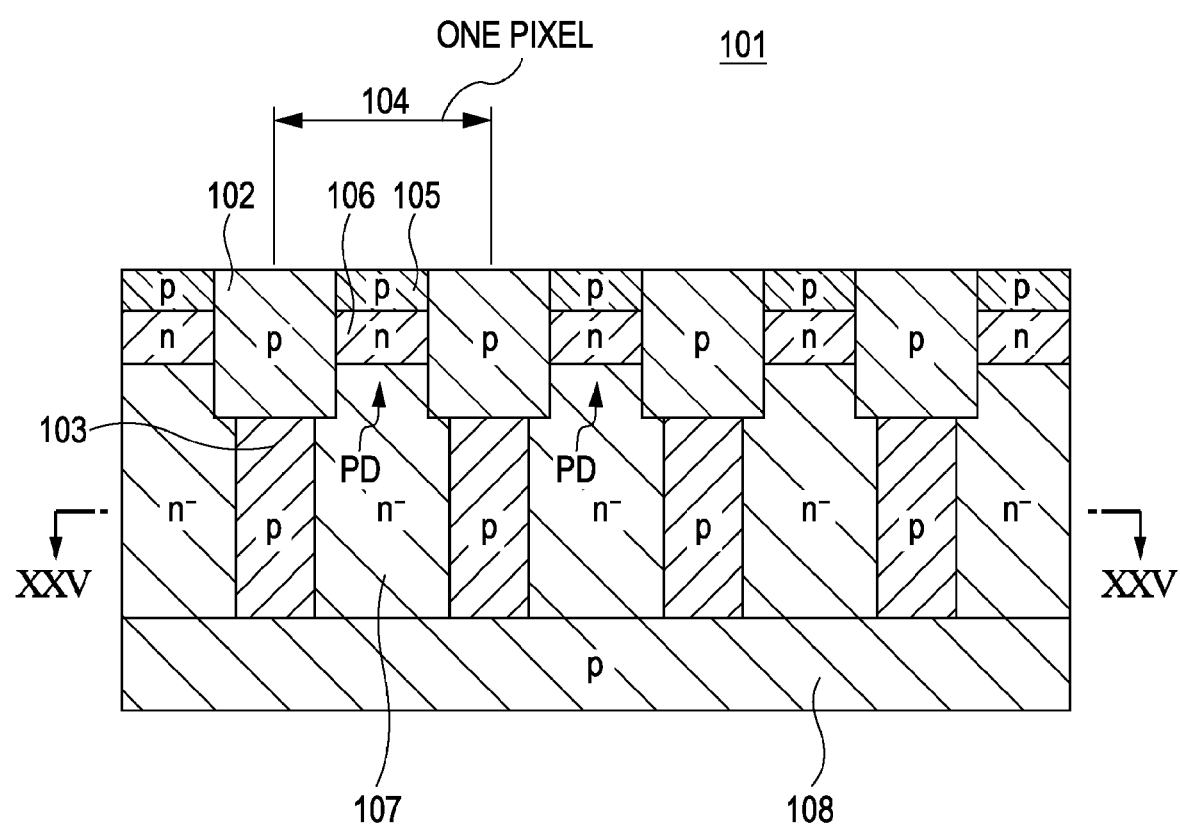
FIG. 24 is a cross-sectional view showing a relevant part of a pixel portion of a solid-state imaging device in the related art.
Figure 25:
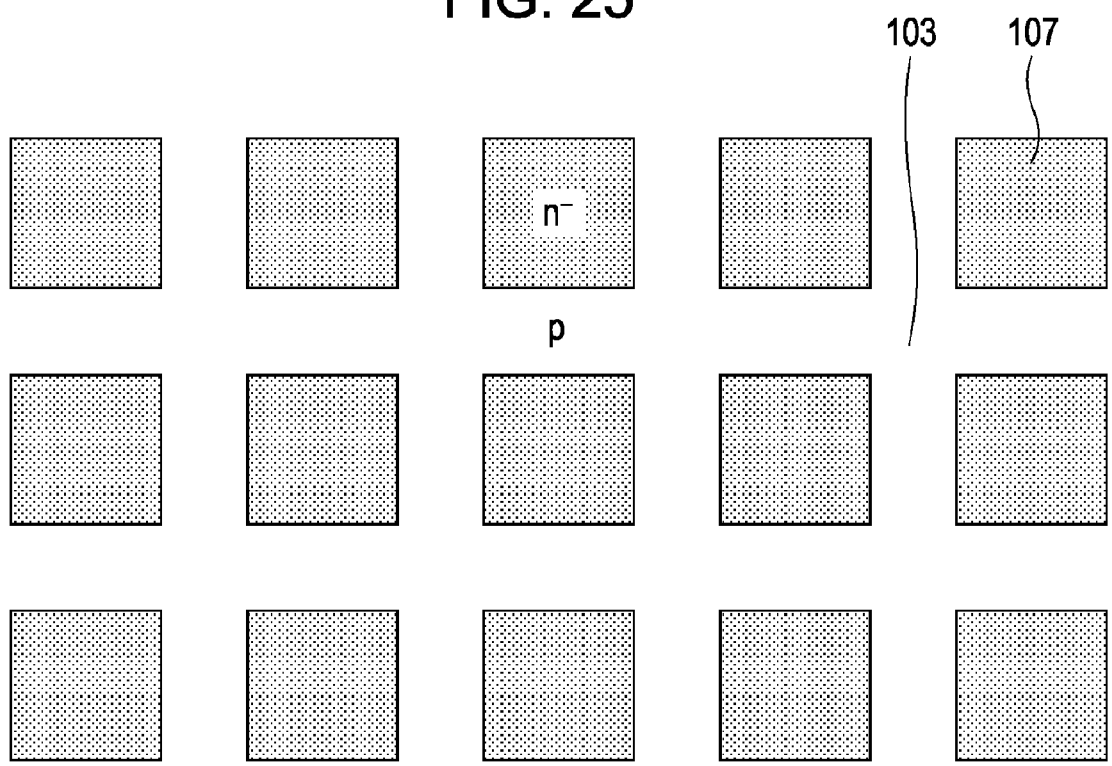
FIG. 25 is a cross-sectional view taken along line XXV-XXV of FIG. 24.
Figure 26:
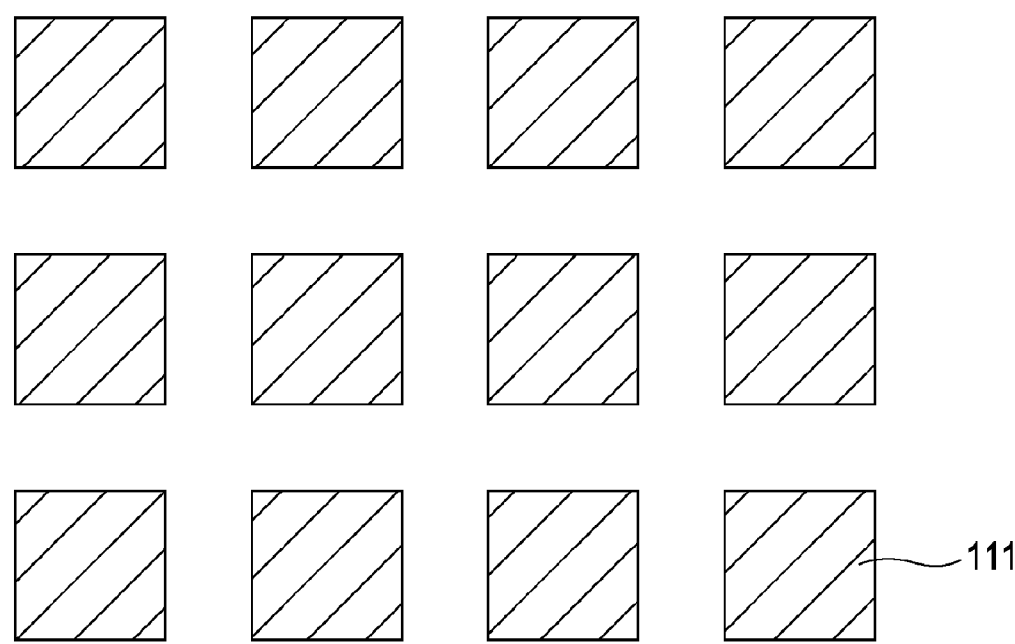
FIG. 26 is a plan view showing an example of a resist mask for forming a grid-shaped pixel isolation region in the related art.
Figure 27:
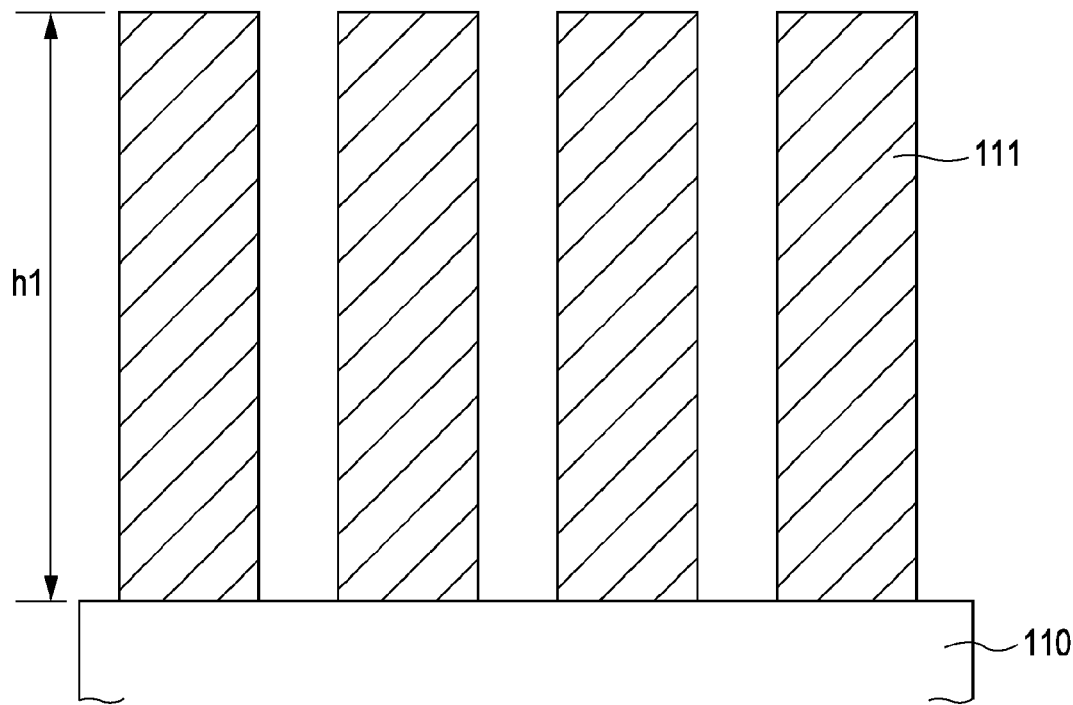
FIG. 27 is a cross-sectional view showing the example of the resist mask for forming a grid-shaped pixel isolation region in the related art.
Figure 28:
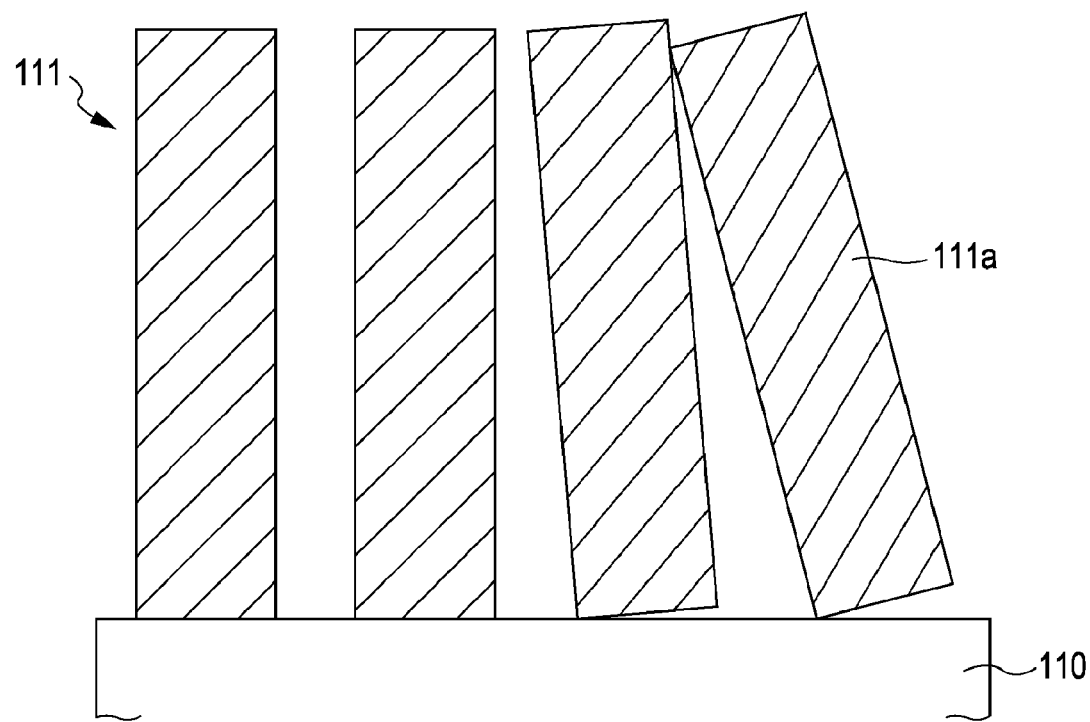
FIG. 28 is a cross-sectional view showing a state in which columnar portions of the resist mask in the related art fall over.
Figure 29:
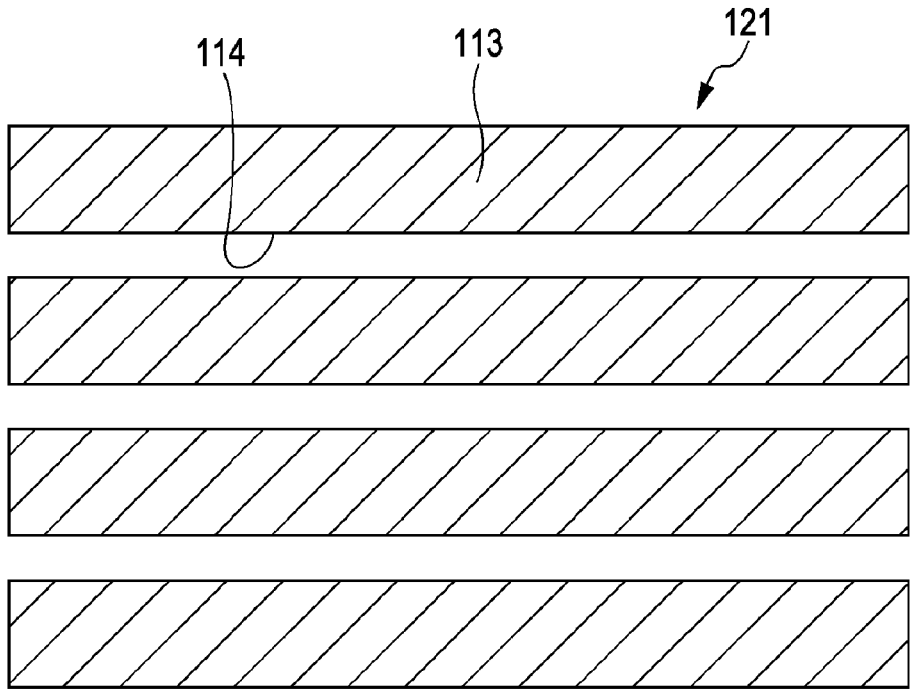
FIG. 29 is a plan view showing another example of a first resist mask for forming a grid-shaped pixel isolation region in the related art.
Figure 30:
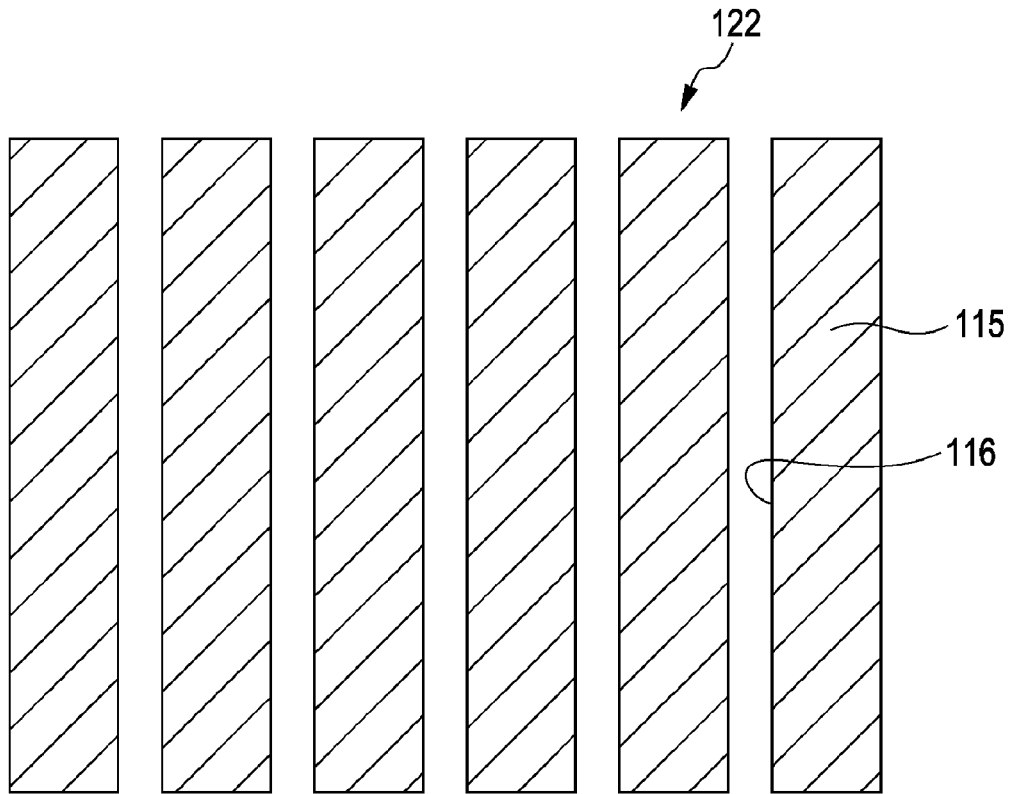
FIG. 30 is a plan view showing the other example of a second resist mask for forming a grid-shaped pixel isolation region in the related art.
Figure 31:
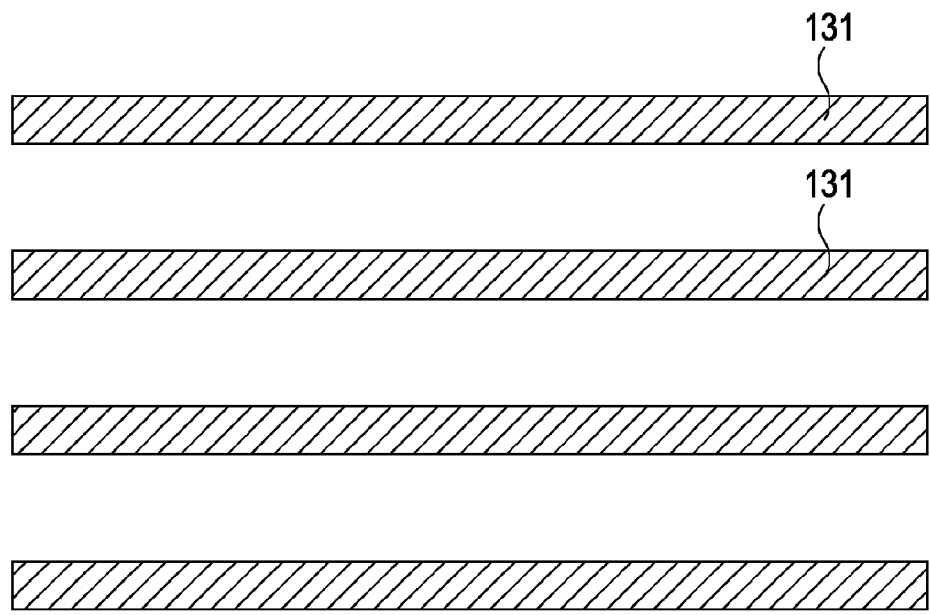
FIG. 31 is a plan view showing a first ion-implanted region formed using the first resist mask shown in FIG. 29.
Figure 32:
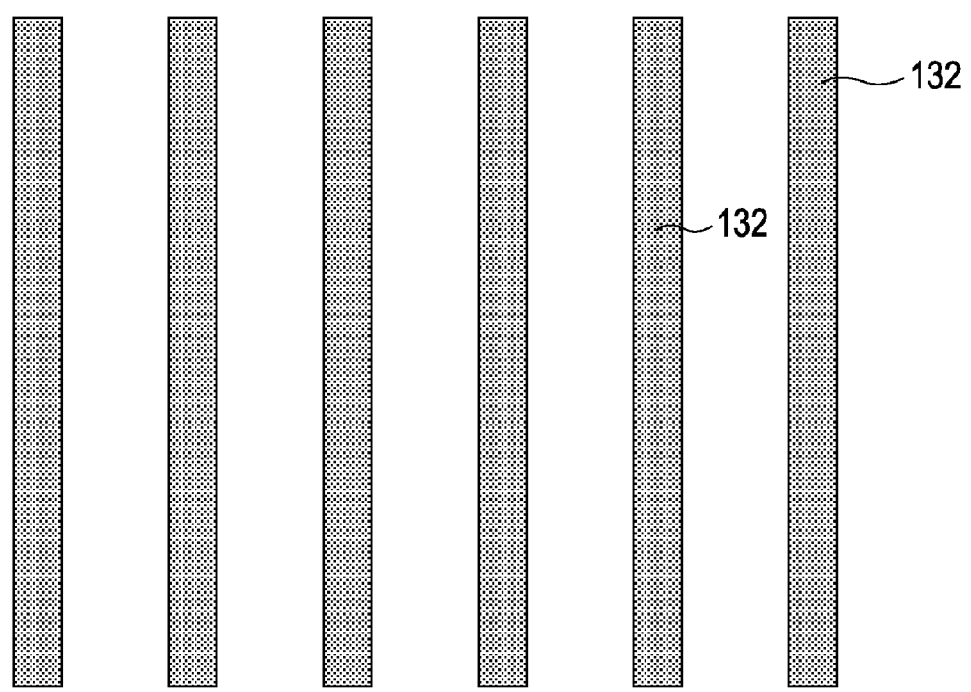
FIG. 32 is a plan view showing a second ion-implanted region formed using the second resist mask shown in FIG. 30.
Figure 33:
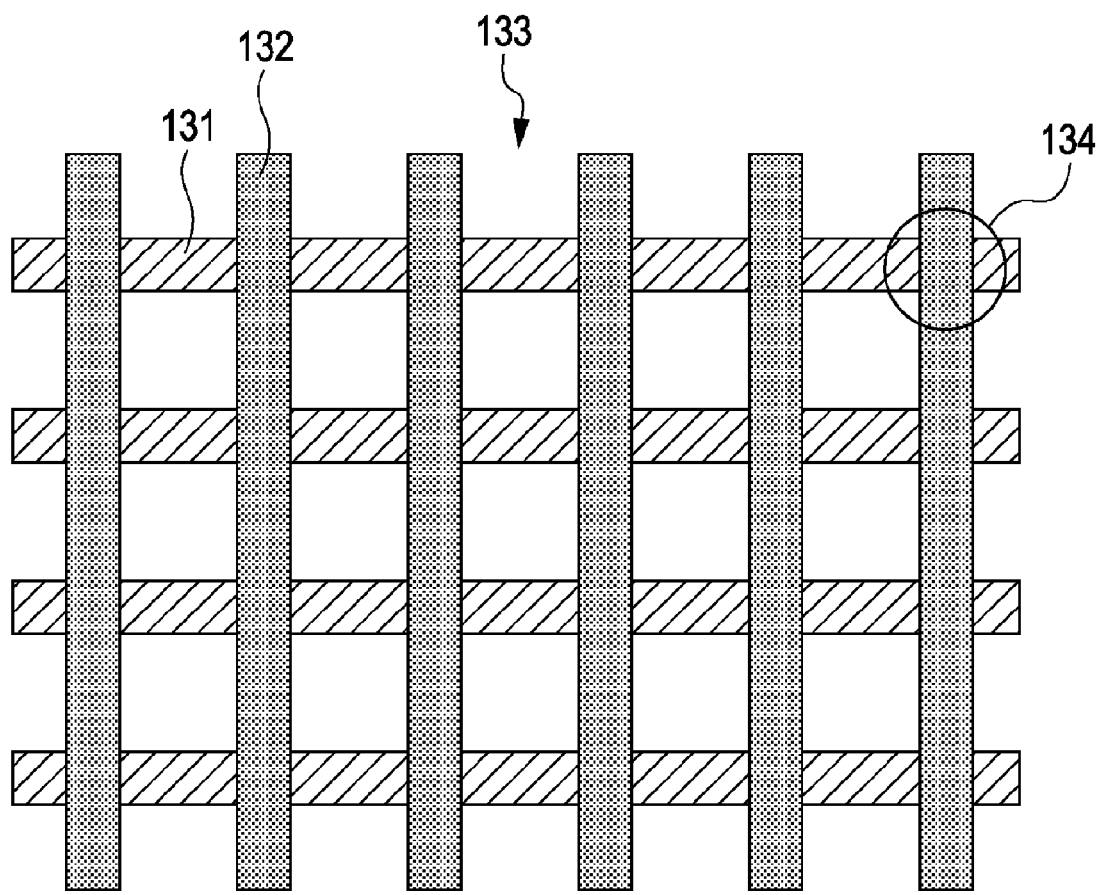
FIG. 33 is a plan view showing a grid-shaped pixel isolation region formed by combining the first ion-implanted region shown in FIG. 31 with the second ion-implanted region shown in FIG. 32.

FIG. 23 shows an embodiment in which the solid-state imaging device according to an embodiment of the present invention is applied to a camera as an example of an electronic apparatus according to an embodiment of the present invention. A camera 71 according to this embodiment includes an optical system (optical lens) 72, a solid-state imaging device 73, and a signal-processing circuit 74. Any one of the solid-state imaging devices of the above-described embodiments is used as the solid-state imaging device 73. The optical system 72 focuses image light (incident light) from an object on an imaging surface of the solid-state imaging device 73. Consequently, signal charges are accumulated in a photoelectric conversion portion of the solid-state imaging device 73 for a certain period of time. The signal-processing circuit 74 performs various types of signal processing for signals output from the solid-state imaging device 73, and outputs the processed signals. The camera 71 of this embodiment includes an embodiment of a camera module in which the optical system 72, the solid-state imaging device 73, and the signal-processing circuit 74 form a module.

An embodiment of the present invention can constitute a camera cell phone or the like represented by, for example, a cell phone equipped with the camera or camera module shown in FIG. 23. Furthermore, the configuration shown in FIG. 23 can be configured as a module having an imaging function, a so-called imaging function module, in which the optical system 72, the solid-state imaging device 73, and the signal-processing circuit 74 form a module. An embodiment of the present invention can constitute an electronic apparatus equipped with such an imaging function module.

According to an electronic apparatus according to this embodiment, in a solid-state imaging device, the pixel size can be reduced with high accuracy and the size of the device can be realized accordingly, and a high image quality can be obtained. Consequently, a high-quality electronic apparatus can be provided.

A solid-state imaging device according to an embodiment of the present invention can be applied to a solid-state imaging device in which a plurality of unit pixels each composed of one photodiode and a plurality of pixel transistors are arranged as described above, or a solid-state imaging device in which a plurality of shared pixels each composed of a plurality of transistors, a transfer transistor, and a plurality of photodiodes are arranged.

According to an ion implantation method according to any of the embodiments of the present invention, a resist mask having a grid-shaped fine pattern can be formed. Accordingly, the ion implantation method can be applied not only to a method of producing a CMOS solid-state imaging device but also to, for example, a method of producing a semiconductor device. Furthermore, the ion implantation mask according to an embodiment of the present invention can be applied also to an annular pattern other than a grid-shaped pattern. The ion implantation mask may be formed of a mask material other than a resist mask, for example, an inorganic mask material.

In the above embodiments, an ion-implanted region including annular regions is formed using two ion implantation masks, namely, the first ion implantation mask and the second ion implantation mask. Alternatively, two or more ion implantation masks may be used in accordance with the shape of the annular regions. Also in such a case, each of the ion implantation masks is formed so as to have a pattern in which main mask portions are connected to each other with bridge portions.

The present application contains subject matter related to that disclosed in Japanese Priority Patent Application JP 2008-239903 filed in the Japan Patent Office on Sep. 18, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A method for ion implantation comprising performing ion implantation a plurality of times using a plurality of ion implantation masks to form a plurality of grid-shaped ion-implanted regions,
wherein,
each of the plurality of ion implantation masks includes a plurality of main mask portions, a plurality of bridge portions connecting the plurality of main mask portions, and a plurality of openings corresponding to at least some of the plurality of grid-shaped ion-implanted regions where ions are to be implanted.

2. The method according to claim 1, wherein the plurality of bridge portions of each of the plurality of ion implantation masks are formed to be complementary to each other.

3. The method according to claim 1, wherein the plurality of bridge portions of each of the plurality of ion implantation masks are evenly formed so that stresses applied to the plurality of bridge portions are balanced between each other.

4. The method according to claim 1, wherein a width of each of the plurality of bridge portions of each of the ion implantation masks is determined such that an amount of misalignment of the plurality of ion implantation masks can be compensated for.

5. The method according to claim 1, wherein performing the ion implantation a plurality of times comprises:
performing a first ion implantation using a first ion implantation mask including—(i) a plurality of first strip-shaped main mask portions extending in a first direction are that are arranged in parallel in a second direction perpendicular to the first direction and (ii) a plurality of first bridge portions each connecting at least two adjacent first strip-shaped main mask portions to form a plurality of first openings; and
performing a second ion implantation using a second ion implantation mask including (i) a plurality of second strip-shaped main mask portions extending in the second direction and that are arranged in parallel in the first direction and (ii) a plurality of second bridge portions each connecting at least two adjacent second strip-shaped main mask portions to form a plurality of second openings.

6. The method according to claim 1, wherein performing the ion implantation a plurality of times comprises:
performing a first ion implantation using a first ion implantation mask including a plurality of first strip-shaped portions each including a plurality of first main mask portions connected to each other in a first direction with a plurality of first bridge portions that are arranged in parallel in a second direction perpendicular to the first direction to form a plurality of first openings divided by the plurality of first bridge portions; and
performing a second ion implantation using a second ion implantation mask including a plurality of second strip-shaped portions each including a plurality of second main mask portions connected to each other in the first direction with a plurality of second bridge portions that are arranged in parallel in the second direction,
wherein
the plurality of second bridge portions are arranged to be shifted from the plurality of first bridge portions in the first direction by a half pitch to form a plurality of second openings divided by the plurality of second bridge portions.

7. The method according to claim 1, wherein a width of each of the plurality of bridge portions is equal to a width of each of the plurality of openings.

8. The method according to claim 1, wherein the plurality of grid-shaped ion-implanted regions are formed at the same depth.

9. The method according to claim 1, wherein the ion implantation is performed three times using each of the plurality of ion implantation masks.

10. The method according to claim 5, wherein a width of each of the plurality of first strip-shaped main mask portions of the first ion implantation mask is equal to a width of each of the plurality of second strip-shaped main mask portions of the second ion implantation mask.

11. A method of producing a solid-state imaging device comprising performing ion implantation a plurality of times using a plurality of ion implantation masks to form a plurality of grid-shaped ion-implanted regions,
wherein:
each of the plurality of ion implantation masks includes a plurality of main mask portions, a plurality of bridge portions connecting the plurality of main mask portions, and a plurality of openings corresponding to at least some of the plurality of grid-shaped ion-implanted regions where ions are to be implanted; and
each of the plurality of grid-shaped ion-implanted regions isolates a plurality of pixels and includes a photoelectric conversion portion.

12. The method according to claim 11, wherein performing the ion implantation a plurality of times comprises:
performing a first ion implantation using a first ion implantation mask including (i) a plurality of first strip-shaped main mask portions extending in a first direction and that are arranged in parallel in a second direction perpendicular to the first direction and (ii) a plurality of first bridge portions each connecting at least two adjacent first strip-shaped main mask portions to form a plurality of first openings; and
performing a second ion implantation using a second ion implantation mask including (i) a plurality of second strip-shaped main mask portions extending in the second direction and that are arranged in parallel in the first direction; and (ii) a plurality of second bridge portions each connecting at least two adjacent second strip-shaped main mask portions to form a plurality of second openings.

13. The method according to claim 11,
wherein performing the ion implantation a plurality of times comprises:
performing a first ion implantation using a first ion implantation mask including a plurality of first strip-shaped portions each including a plurality of first main mask portions connected to each other in a first direction with a plurality of first bridge portions that are arranged in parallel in a second direction perpendicular to the first direction to form a plurality of first openings divided by the plurality of first bridge portions; and
performing a second ion implantation using a second ion implantation mask including a plurality of second strip-shaped portions each including a plurality of second main mask portions connected to each other in the first direction with a plurality of second bridge portions that are arranged in parallel in the second direction,
wherein,
the plurality of second bridge portions are arranged to be shifted from the plurality of first bridge portions in the first direction by a half pitch to form a plurality of second openings divided by the plurality of second bridge portions.

14. The method according to claim 12, wherein the plurality of first bridge portions of the first ion implantation mask and the plurality of second bridge portions of the second ion implantation mask are formed to be complementary to each other.

15. The method according to claim 12, wherein:
the plurality of first bridge portions of the first ion implantation mask are evenly formed so that stresses applied to the plurality of first bridge portions are balanced between each other; and
the plurality of second bridge portions of the second ion implantation mask are evenly formed so that stresses applied to the plurality of second bridge portions are balanced between each other.

16. The method according to claim 11, wherein a width of each of the plurality of bridge portions is equal to a width of each of the plurality of openings.

17. The method according to claim 11, wherein the plurality of grid-shaped ion-implanted regions are formed at the same depth.

18. The method according to claim 11, wherein the ion implantation is performed three times using each of the plurality of ion implantation masks.

19. The method according to claim 11, wherein a length of each of the plurality of openings is twice of a length of each of the plurality of pixels.

20. The method according to claim 11, wherein a width of each of the plurality of main mask portions is equal to a width of each of the plurality of pixels.

21. The method according to claim 12, wherein a width of each of the plurality of first strip-shaped main mask portions of the first ion implantation mask is equal to a width of each of the plurality of second strip-shaped main mask portions of the second ion implantation mask.

\* \* \* \* \*